United States Patent
Bae et al.

(10) Patent No.: US 11,706,940 B2
(45) Date of Patent: Jul. 18, 2023

(54) LIGHT EMITTING DEVICE INCLUDING PLANARIZATION LAYER, METHOD OF MANUFACTURING THE LIGHT EMITTING DEVICE, AND DISPLAY APPARATUS INCLUDING THE LIGHT EMITTING DEVICE

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Juncheol Bae, Suwon-si (KR); Wonseok Jang, Suwon-si (KR); Wonjae Joo, Seongnam-si (KR); Dongmok Whang, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 54 days.

(21) Appl. No.: 17/245,482

(22) Filed: Apr. 30, 2021

(65) Prior Publication Data
US 2022/0020949 A1 Jan. 20, 2022

(30) Foreign Application Priority Data
Jul. 15, 2020 (KR) .................. 10-2020-0087650

(51) Int. Cl.
*H10K 50/818* (2023.01)
*H10K 50/852* (2023.01)
(Continued)

(52) U.S. Cl.
CPC ......... *H10K 50/818* (2023.02); *H10K 50/852* (2023.02); *H10K 50/856* (2023.02); *H10K 71/00* (2023.02)

(58) Field of Classification Search
CPC .................................................... H10K 50/818
See application file for complete search history.

(56) References Cited

U.S. PATENT DOCUMENTS 5,642,978 A * 7/1997 Lahne ............... H01L 21/67265
414/416.03
5,766,058 A * 6/1998 Lee ........................ B24B 37/30
451/388
(Continued)

FOREIGN PATENT DOCUMENTS

EP 3614447 A1 2/2020
JP 3979450 B2 9/2007
(Continued)

OTHER PUBLICATIONS

Zhu et al., "Graphene and Graphene Oxide: Synthesis, Properties, and Applications," 2010, Advanced Materials, vol. 22, 19 pages total, XP 055100171.
(Continued)

*Primary Examiner* — Caleb E Henry
(74) *Attorney, Agent, or Firm* — Sughrue Mion, PLLC

(57) ABSTRACT

Provided a light emitting device including a reflective layer including a plurality of nanostructures that are periodically two-dimensionally arranged, a planarization layer disposed on the reflective layer, a first electrode disposed on the planarization layer, an organic emission layer disposed on the first electrode, and a second electrode disposed on the organic emission layer, wherein the planarization layer includes a conductive material that is transparent with respect to light emitted by the organic emission layer, and wherein the planarization layer is disposed on upper surfaces (Continued)

of the plurality of nanostructures such that an air gap is provided between adjacent nanostructures of the plurality of nanostructures.

26 Claims, 20 Drawing Sheets

(51) Int. Cl.
*H10K 50/856* (2023.01)
*H10K 71/00* (2023.01)

(56) References Cited

U.S. PATENT DOCUMENTS

| | | | |
|---|---|---|---|
| 6,491,881 B2* | 12/2002 | Fryer | A61L 2/28 436/1 |
| 9,196,868 B2 | 11/2015 | Young et al. | |
| 10,615,561 B2 | 4/2020 | Joo et al. | |
| 2002/0182447 A1* | 12/2002 | Bellido-Gonzales | C23C 14/0623 427/527 |
| 2005/0194896 A1* | 9/2005 | Sugita | H01L 51/5268 313/506 |
| 2009/0015142 A1 | 1/2009 | Potts et al. | |
| 2012/0003497 A1* | 1/2012 | Handy | G01B 11/16 118/712 |
| 2013/0202387 A1* | 8/2013 | Hiroki | H01L 21/67184 414/217 |
| 2014/0251204 A1* | 9/2014 | Najmaei | C30B 25/04 117/88 |
| 2014/0353166 A1* | 12/2014 | Iezzi | B01J 35/004 502/220 |
| 2015/0111392 A1* | 4/2015 | Ishii | H01L 21/0262 438/758 |
| 2015/0118487 A1* | 4/2015 | Wolden | C03C 17/3464 204/192.15 |
| 2015/0340659 A1* | 11/2015 | Shin | H01L 51/5268 257/40 |
| 2015/0345010 A1* | 12/2015 | Muratore | C23C 14/0623 204/192.15 |
| 2016/0093491 A1* | 3/2016 | Choi | H01L 29/78681 438/479 |
| 2016/0164038 A1* | 6/2016 | Shin | H01L 51/5268 257/40 |
| 2016/0240719 A1* | 8/2016 | Lin | H01L 21/02485 |
| 2016/0268553 A1* | 9/2016 | Free | H01L 51/56 |
| 2016/0301022 A1 | 10/2016 | Yoon et al. | |
| 2019/0237688 A1* | 8/2019 | Shin | H10K 71/00 |
| 2022/0020949 A1* | 1/2022 | Bae | H10K 50/856 |

FOREIGN PATENT DOCUMENTS

| | | |
|---|---|---|
| JP | 5969167 B2 | 8/2016 |
| JP | 2019-83094 A | 5/2019 |
| KR | 10-2014-0024295 A | 2/2014 |
| KR | 10-1487729 B1 | 1/2015 |
| KR | 10-2015-0092900 A | 8/2015 |
| KR | 10-2016-0070673 A | 6/2016 |
| KR | 10-2018-0121375 A | 11/2018 |

OTHER PUBLICATIONS

Communication dated Oct. 22, 2021 by the European Patent Office in European Patent Application No. 21172738.3.
"Graphenes, Graphene Oxides (GOs)," Tokyo Chemical Industry Co., Ltd., Tcimail issue No. 186, Apr. 23, 2021, Total 3 pages (https://www.tcichemicals.com/eshop/ko/kr/category_index/12962/).
Imae et al., "Facile fabrication of transparent conductive graphene/silica composite films with high mechanical strength," Elsevier, Synthetic Metals, vol. 224, 2017, pp. 33-35.
Xu et al., "Finite-difference time-domain calculation of spontaneous emission lifetime in a microcavity," Journal of the Optical Society of America B, vol. 16, No. 3, Mar. 1999, pp. 465-474.

* cited by examiner

FIG. 6

| Sample | Graphene oxide | | DI | Ethanol | TMOS | | GO w%, vs TMOS |
|---|---|---|---|---|---|---|---|
| | 10mg/ml in DI | GO (g) | | | Vol. | Weight | |
| 2wt% | 2wt% | 0.002g | 0.8ml | 1.0ml | 0.1ml | 0.103g | 1.9% |
| 4wt% | 4wt% | 0.004g | 0.6ml | 1.0ml | 0.1ml | 0.103g | 3.9% |
| 6wt% | 6wt% | 0.006g | 0.4ml | 1.0ml | 0.1ml | 0.103g | 5.8% |
| 8wt% | 8wt% | 0.008g | 0.2ml | 1.0ml | 0.1ml | 0.103g | 7.8% |
| 10wt% | 10wt% | 0.010g | 0.0ml | 1.0ml | 0.1ml | 0.103g | 9.7% |

RMS : 0.434nm

RMS : 0.318nm

LIGHT EMITTING DEVICE INCLUDING PLANARIZATION LAYER, METHOD OF MANUFACTURING THE LIGHT EMITTING DEVICE, AND DISPLAY APPARATUS INCLUDING THE LIGHT EMITTING DEVICE

CROSS-REFERENCE TO RELATED APPLICATION

This application is based on and claims priority under 35 U.S.C. § 119 to Korean Patent Application No. 10-2020-0087650, filed on Jul. 15, 2020, in the Korean Intellectual Property Office, the disclosure of which is incorporated by reference herein in its entirety.

BACKGROUND

1. Field

Example embodiments of the present disclosure relate to a light emitting device, a method of manufacturing the light emitting device, and a display apparatus including the light emitting device, and more particularly to, an organic light emitting device that has high color purity without using a color filter and is more easily manufactured, a method of manufacturing the organic light emitting device, and an organic light emitting display apparatus.

2. Description of Related Art

An organic light emitting device (OLED) is a display apparatus that forms an image via light emission according to a combination of holes supplied from an anode and electrons supplied from a cathode in an organic emission layer. The OLED has excellent display characteristics such as a wide viewing angle, a fast response speed, a small thickness, a low manufacturing cost, and a high contrast.

Further, the OLED may emit a wanted color according to selection of an appropriate material as a material of the organic emission layer. According to this principle, it may be possible to manufacture a color display apparatus by using the OLED. For example, an organic emission layer of a blue pixel may include an organic material that generates blue light, an organic emission layer of a green pixel may include an organic material that generates green light, and an organic emission layer of a red pixel may include an organic material that generates red light. Also, a white OLED may be manufactured by arranging a plurality of organic materials which respectively generate blue light, green light, and red light in one organic emission layer or by arranging pairs of two or more kinds of organic materials in a complementary relationship with each other.

SUMMARY

One or more example embodiments provide a light emitting device, a method of manufacturing the light emitting device, and a display apparatus including the light emitting device, and more particularly an organic light emitting device that has high color purity without using a color filter and is more easily manufactured, a method of manufacturing the organic light emitting device, and an organic light emitting display apparatus.

Additional aspects will be set forth in part in the description which follows and, in part, will be apparent from the description, or may be learned by practice of the example embodiments of the disclosure.

According to an aspect of an example embodiment, there is provided a light emitting device including a reflective layer including a plurality of nanostructures that are periodically two-dimensionally arranged, a planarization layer disposed on the reflective layer, a first electrode disposed on the planarization layer, an organic emission layer disposed on the first electrode, and a second electrode disposed on the organic emission layer, wherein the planarization layer includes a conductive material that is transparent with respect to light emitted by the organic emission layer, and wherein the planarization layer is disposed on upper surfaces of the plurality of nanostructures such that an air gap is provided between adjacent nanostructures of the plurality of nanostructures.

The planarization layer may further include an organic-inorganic hybrid layer in which reduced graphene oxide is dispersed.

The organic-inorganic hybrid layer may include an organic silicon compound.

A proportion of the reduced graphene oxide dispersed in the planarization layer may be in a range of 1.5 wt % to 15 wt %.

A thickness of the planarization layer may be in a range of 10 nm to 50 nm.

A surface roughness of the planarization layer may be less than 1 nm root-mean-square (RMS).

The surface roughness of the planarization layer may be in a range of 0.3 nm RMS to 0.5 nm RMS.

The first electrode may be a transparent electrode and the second electrode may be a semi-transmissive electrode that is configured to reflect part of light and transmit a remaining part of the light.

The second electrode may include a reflective metal, and a thickness of the second electrode may be in a range of 10 nm to 50 nm.

The reflective layer and the second electrode may form a micro cavity having a resonance wavelength.

The resonance wavelength of the micro cavity is $\lambda$, a diameter of each of the plurality of nanostructures of the reflective layer, a height of each of the plurality of nanostructures, and a period of the plurality of nanostructures may be determined such that an optical length of the micro cavity satisfies $n\lambda/2$, where n is a natural number.

A period of the plurality of nanostructures may be less than the resonance wavelength of the micro cavity.

The reflective layer may include a base, and the plurality of nanostructures may protrude toward the planarization layer from an upper surface of the base.

The reflective layer may further include a plurality of recesses that are recessed from the upper surface of the base and two-dimensionally provided.

The reflective layer and the second electrode may form a micro cavity having a resonance wavelength, wherein the organic emission layer may be configured to emit visible light including light of a first wavelength and light of a second wavelength, wherein the first wavelength is $\lambda$, a diameter of each of the plurality of nanostructures of the reflective layer, a height of each of the plurality of nanostructures, and a period of the plurality of nanostructures may be determined such that an optical length of the micro cavity satisfies $n\lambda/2$, where n is a natural number, and wherein a diameter of each of the plurality of recesses may be determined such that the plurality of recesses are configured to absorb the light of the second wavelength.

The reflective layer may include a metal material including silver (Ag), aluminum (Al), gold (Au), nickel (Ni), or an alloy thereof.

According to another aspect of an example embodiment, there is provided a display apparatus including a first pixel configured to emit light of a first wavelength, and a second pixel configured to emit light of a second wavelength different from the first wavelength, wherein the first pixel includes a reflective layer including a plurality of nanostructures periodically two-dimensionally arranged, a planarization layer disposed on the reflective layer, a first electrode disposed on the planarization layer, an organic emission layer disposed on the first electrode, the organic emission layer being configured to emit visible light including the light of the first wavelength and the light of the second wavelength, and a second electrode disposed on the organic emission layer, wherein the planarization layer includes a conductive material that is transparent with respect to light emitted by the organic emission layer, and wherein the planarization layer is disposed on upper surfaces of the plurality of nanostructures such that an air gap is provided between adjacent nanostructures of the plurality of nano structures.

The planarization layer may further include an organic-inorganic hybrid layer in which reduced graphene oxide is dispersed.

The organic-inorganic hybrid layer may include an organic silicon compound.

A proportion of the reduced graphene oxide dispersed in the planarization layer may be in a range of 1.5 wt % to 15 wt %.

A thickness of the planarization layer may be in a range of 10 nm to 50 nm.

A surface roughness of the planarization layer may be less than 1 nm root-mean-square (RMS).

The surface roughness of the planarization layer may be in a range of 0.3 nm RMS to 0.5 nm RMS.

The first electrode may be a transparent electrode and the second electrode may be a semi-transmissive electrode that is configured to reflect part of light and transmit a remaining part of the light.

The reflective layer and the second electrode may form a micro cavity having a resonance wavelength corresponding to the first wavelength, and when the first wavelength is $\lambda$, a diameter of each of the plurality of nanostructures of the reflective layer, a height of each of the plurality of nanostructures, and a period of the plurality of nanostructures may be determined such that an optical length of the micro cavity satisfies $n\lambda/2$, where n is a natural number.

According to yet another aspect of an example embodiment, there is provided a method of manufacturing a light emitting device, the method including coating a substrate with a mixture of graphene oxide and tetramethyl orthosilicate (TMOS) sol in a solvent, curing the mixture coated on the substrate, annealing the cured mixture to reduce graphene oxide to reduced graphene oxide and form a planarization layer, transferring the planarization layer to a reflective layer including a plurality of nanostructures that are periodically two-dimensionally arranged, disposing a first electrode on the planarization layer, disposing an organic emission layer on the first electrode, and disposing a second electrode on the organic emission layer, wherein the planarization layer is conductive and transparent with respect to light generated from the organic emission layer, and wherein the planarization layer is disposed on upper surfaces of the plurality of nanostructures such that an air gap is provided between adjacent nanostructures of the plurality of nanostructures.

According to yet another aspect of an example embodiment, there is provided a light emitting device including a reflective layer including a plurality of nanostructures that are periodically two-dimensionally provided, and a plurality of recesses that are periodically two-dimensionally provided, a planarization layer disposed on the reflective layer, a first electrode disposed on the planarization layer, an organic emission layer disposed on the first electrode, and a second electrode disposed on the organic emission layer, wherein the planarization layer includes a conductive material transparent with respect to light generated from the organic emission layer, and wherein the planarization layer is disposed on upper surfaces of the plurality of nanostructures such that an air gap is provided between adjacent nanostructures of the plurality of nanostructures.

BRIEF DESCRIPTION OF THE DRAWINGS

The above and/or other aspects, features, and advantages of certain example embodiments will be more apparent from the following description taken in conjunction with the accompanying drawings, in which:

FIG. 6 is a table showing an example of various combinations of materials for manufacturing a planarization layer;

DETAILED DESCRIPTION

Figure 1:
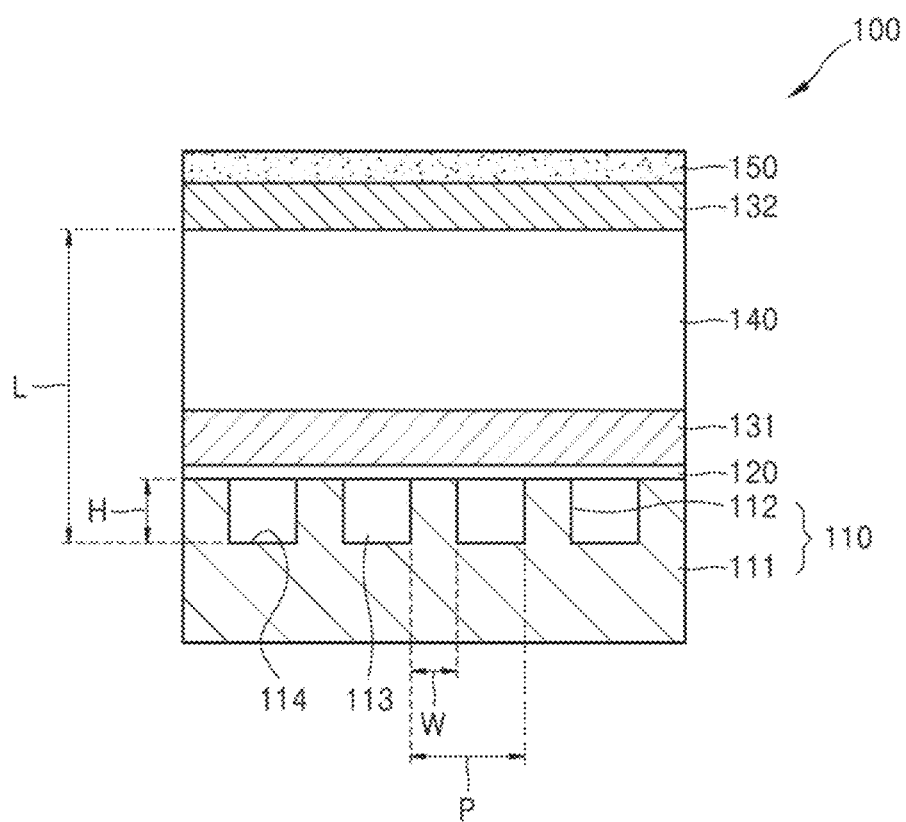
FIG. 1 is a cross-sectional view schematically showing a structure of a light emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, with reference to the accompanying drawings, a light emitting device, a method of manufacturing the light emitting device and a display apparatus including the light emitting device will be described in detail. Like reference numerals refer to like elements throughout, and in the drawings, sizes of elements may be exaggerated for clarity and convenience of explanation. The example embodiments described below are merely exemplary, and various modifications may be possible from the embodiments.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. The present disclosure is not limited to the order the operations are mentioned.

The term used in the embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view schematically showing a structure of a light emitting device 100 according to an example embodiment. Referring to FIG. 1, the light emitting device 100 according to an example embodiment may include a reflective layer 110 including a plurality of nanostructures 112 that are periodically two-dimensionally arranged, a transparent planarization layer 120 disposed on the reflective layer 110, a first electrode 131 disposed on the planarization layer 120, an organic emission layer 140 disposed on the first electrode 131, and a second electrode 132 disposed on the organic emission layer 140. The light emitting device 100 may further include a transparent passivation layer 150 disposed on the second electrode 132 opposite to the organic emission layer 140 to protect the second electrode 132.

Figure 2:
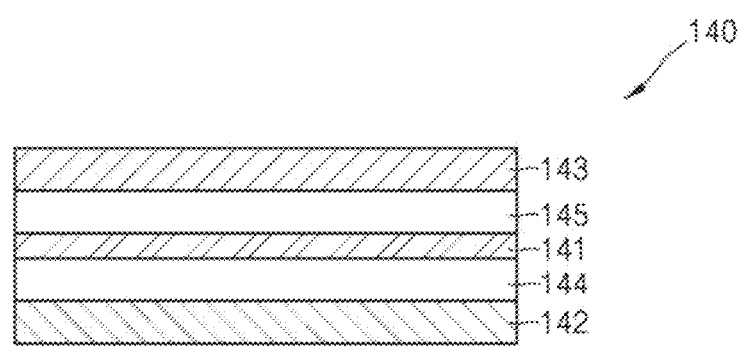
FIG. 2 is a cross-sectional view showing in more detail an example structure of an organic emission layer illustrated in FIG. 1.

The light emitting device 100 may be an organic light emitting diode (OLED). For example, FIG. 2 is a cross-sectional view showing an example structure of the organic emission layer 140 illustrated in FIG. 1 in more detail. Referring to FIG. 2, the organic emission layer 140 may include a hole injection layer 142 disposed on the planarization layer 120, an organic emission material layer 141 disposed on the hole injection layer 142, and an electron injection layer 143 disposed on the organic emission material layer 141. In this structure, holes provided through the hole injection layer 142 and electrons provided through the electron injection layer 143 may be combined in the organic emission material layer 141 to generate light. A wavelength of the generated light may be determined according to an energy band gap of a light emitting material of the organic emission material layer 141.

In addition, the organic emission layer 140 may further include a hole transfer layer 144 disposed between the hole injection layer 142 and the organic emission material layer 141 in order to further facilitate the transport of holes. In addition, the organic emission layer 140 may further include an electron transfer layer 145 disposed between the electron injection layer 143 and the organic emission material layer 141 in order to further facilitate the transport of electrons. In addition, the organic emission layer 140 may include various additional layers as necessary. For example, the organic emission layer 140 may further include an electron block layer between the hole transfer layer 144 and the organic emission material layer 141, and may also further include a hole block layer between the organic emission material layer 141 and the electron transfer layer 145.

The organic emission material layer 141 may be configured to emit visible light. For example, the organic emission material layer 141 may be configured to emit light in a wavelength band among a wavelength band of red light, a wavelength band of green light, and a wavelength band of blue light. The organic emission material layer 141 may be configured to emit white visible light including red light, green light, and blue light.

Figure 3:
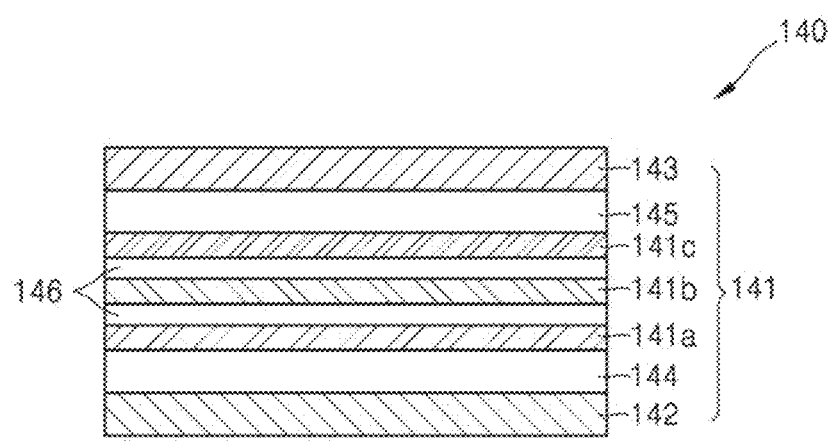
FIG. 3 is a cross-sectional view showing in more detail another example structure of an organic emission layer illustrated in FIG. 1.

For example, FIG. 3 is a cross-sectional view showing another example structure of the organic emission layer 140 illustrated in FIG. 1 in more detail. Referring to FIG. 3, the organic emission material layer 141 may include a first organic emission material layer 141a that emits red light, a second organic emission material layer 141b that emits green light, and a third organic emission material layer 141c that emits blue light between the hole transfer layer 144 and the electron transfer layer 145. Further, an exciton blocking layer 146 may be disposed between the first organic emission material layer 141a and the second organic emission material layer 141b and between the second organic emission material layer 141b and the third organic emission material layer 141c. Then, the organic emission layer 140 may emit white light. However, the structure of the organic emission layer 140 that emits white light is not limited thereto. Instead of including the three organic emission material layers 141a, 141b, and 141c, the organic emission layer 140 may also include two organic emission material layers in complementary color relation to each other.

The first electrode 131 disposed on the lower surface of the organic emission layer 140 may serve as an anode that provides holes. The second electrode 132 disposed on the upper surface of the organic emission layer 140 may serve as a cathode that provides electrons. To this end, the first electrode 131 may include a material having a relatively high work function, and the second electrode 132 may include a material having a relatively low work function.

In addition, the first electrode 131 may be a transparent electrode having a property of transmitting light (e.g., visible light). For example, the first electrode 131 may include transparent conductive oxide, such as indium tin oxide (ITO), indium zinc oxide (IZO), or aluminum zinc oxide (AZO).

The second electrode 132 may be a semi-transmissive electrode that reflects part of light and transmits the remaining part of light. To this end, the second electrode 132 may include a very thin reflective metal. For example, the second electrode 132 may include silver (Ag), aluminum (Al), gold (Au), nickel (Ni), or an alloy thereof, or a multilayer structure of silver (Ag) and magnesium (Mg) or a multilayer structure of aluminum (Al) and lithium (Li). The entire thickness of the second electrode 132 may be about 10 nm to about 50 nm. Because the thickness of the second electrode 132 is very thin, part of light may pass through the reflective metal.

The reflective layer 110 may be configured to reflect light generated from the organic emission layer 140 and transmitted through the first electrode 131. In addition, the reflective layer 110 may include a conductive material. To this end, the reflective layer 110 may include silver (Ag), gold (Au), aluminum (Al), nickel (Ni), or an alloy thereof. However, the reflective layer 110 is not limited thereto, and may include other reflective materials having high reflectivity and conductivity.

The reflective layer 110 may form a micro cavity together with the second electrode 132. For example, the micro cavity may be formed between the reflective layer 110 and the second electrode 132 of the light emitting device 100. For example, light generated from the organic emission layer 140 may reciprocate and resonate between the reflective layer 110 and the second electrode 132, and then light corresponding to the resonance wavelength of the micro cavity may be emitted to the outside through the second electrode 132.

The resonance wavelength of the micro cavity formed between the reflective layer 110 and the second electrode 132 may be determined by an optical length L of the micro cavity. For example, when the resonance wavelength of the micro cavity is $\lambda$, the optical length L of the micro cavity may be $n\lambda/2$, where n is a natural number. The optical length L of the micro cavity may be determined as the sum of the optical thickness of layers forming the micro cavity between the reflective layer 110 and the second electrode 132, a phase delay by the second electrode 132, and a phase shift (e.g., a phase delay) by the reflective layer 110. Here, the optical thickness of the layers forming the micro cavity between the reflective layer 110 and the second electrode 132 is not a simple physical thickness, but is the thickness considering the refractive index of materials of the layers forming the micro cavity. For example, the optical thickness of the layers forming the micro cavity may be the sum of the optical thickness of the planarization layer 120, the optical thickness of the first electrode 131, and the optical thickness of the organic emission layer 140.

According to the example embodiment, the optical length L of or the resonance wavelength of the micro cavity may be adjusted by adjusting only the phase shift by the reflective layer 110 while fixing the optical thickness of the layers forming the micro cavity and the phase delay by the second electrode 132. In order to control the phase shift by the reflective layer 110, a phase modulation surface may be formed on the reflective surface of the reflective layer 110 in contact with the planarization layer 120. The phase modulation surface may include very small patterns in the nanoscale. For example, the phase modulation surface of the reflective layer 110 may have a meta structure in which nano patterns having a size smaller than the wavelength of visible light are periodically disposed.

Referring back to FIG. 1, the reflective layer 110 may include a base 111 and the phase modulation surface formed on an upper surface 114 of the base 111. The phase modulation surface of the reflective layer 110 may include a plurality of nanostructures 112 periodically formed on the upper surface 114 of the base 111. The plurality of nanostructures 112 may have a post shape protruding from the upper surface 114 of the base 111 toward the planarization layer 120. For example, the plurality of nanostructures 112 may have a cylindrical shape. The plurality of nanostructures 112 may be integrally formed with the base 111. The reflective layer 110 may be disposed such that the upper surfaces of the plurality of nanostructures 112 are in contact with the planarization layer 120.

When each of the nanostructures 112 is, for example, a cylinder, the optical characteristics of the phase modulation surface, for example, the phase delay of reflected light may be determined by a diameter W of each of the nanostructures 112, a height H of each of the nanostructures 112 and a pitch or period P of the plurality of nanostructures 112. When each of the nanostructures 112 is a polygonal column, the optical characteristics of the phase modulation surface may be determined by a maximum width W of each of the nanostructures 112, the height H of each of the nanostructures 112, and the pitch or the period P of the plurality of nanostructures 112.

The diameter W, the height H, and the period P of the nanostructures 112 may be constant with respect to the entire region of the phase modulation surface. For example, the diameter W of the nanostructure 112 may be from about 30 nm to about 250 nm, the height H of the nanostructure 112 may be from about 0 nm to about 150 nm, and the period P of the plurality of nanostructures 112 may be from about 100 nm to about 300 nm.

When the size of each of the nanostructures 112 of the phase modulation surface is smaller than the resonance wavelength as described above, a plurality of nano-light resonance structures may be formed while incident light resonates in the periphery of the nanostructures 112. In particular, in the incident light, an electric field component may not penetrate into a space 113 between the nanostructures 112, and only a magnetic field component may resonate in the periphery of the nanostructures 112. Accordingly, the plurality of nano-light resonant structures formed in the space 113 between the nanostructures 112 may be a cylinder type magnetic resonator in which the magnetic field component of the incident light resonates in the periphery of the nanostructures 112. As a result, a phase shift greater than a simple phase shift due to an effective optical distance (H×n) determined by the product of the height H of the nanostructures 112 and a refractive index n of the nanostructures 112 may occur on the phase modulation surface of the reflective layer 110.

Accordingly, the resonance wavelength of the micro cavity may be determined by the diameter W of each of the nanostructures 112 of the phase modulation surface, the height H of each of the nanostructures 112 and the period P of the plurality of nanostructures 112. In other words, when the resonance wavelength of the micro cavity is $\lambda$, the diameter W of each of the nanostructures 112 of the phase modulation surface, the height H of each of the nanostructures 112 and the period P of the plurality of nanostructures 112 of the phase modulation surface may be selected such that the optical length L of the micro cavity satisfies $n\lambda/2$, where n is a natural number.

Then, the resonance wavelength of the micro cavity may more easily match with the emitting wavelength or emitting color of the light emitting device 100. For example, when the light emitting device 100 is a red light emitting device, the diameter W of each of the nanostructures 112 of the phase modulation surface, the height H of each of the nanostructures 112 and the period P of the plurality of nanostructures 112 of the phase modulation surface may be selected such that the resonance wavelength of the micro cavity corresponds to a red wavelength band. As described above, it may be possible to determine the emitting wavelength of the light emitting device 100 only by the structure of the phase modulation surface of the reflective layer 110.

Figure 4:
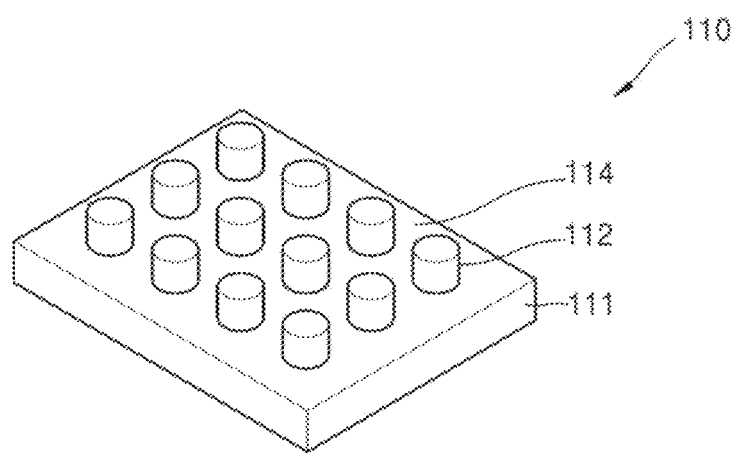
FIG. 4 is a perspective view schematically showing an example structure of a reflective layer illustrated in FIG. 1.

In order to prevent or reduce the micro cavity from having a polarization dependency, the plurality of nanostructures 112 may be regularly and periodically arranged to have a 4-fold symmetry characteristic. When the micro cavity has the polarization dependency, only light of a specific polarization component may resonate, which may deteriorate the light emitting efficiency of the light emitting device 100. For example, FIG. 4 is a perspective view schematically showing an example structure of the reflective layer 110 illustrated in FIG. 1. Referring to FIG. 4, the plurality of nanostructures 112 having a cylindrical shape on the upper surface 114 of the base 111 may be arranged two-dimensionally in the shape of a regular square array. In FIG. 4, although the nanostructure 112 has the cylindrical shape, the shape of the nanostructure 112 is not necessarily limited thereto. For example, the nanostructure 112 may be in the shape of a cylindrical column, an elliptical column, a pentagonal or larger polygonal column or a cruciform column.

In addition, in FIG. 4, the plurality of nanostructures 112 is arranged in the shape of the regular square array. In this case, intervals between the two adjacent nanostructures 112 in the entire region of a phase modulation surface may be constant. However, if the plurality of nanostructures 112 has a 4-fold symmetry characteristic, the plurality of nanostructures 112 may be arranged in any other type of array. For example, the plurality of nanostructures 112 may be two-dimensionally arranged in the shape of a hexagonal array, or two-dimensionally arranged in the shape of a body-centered square. For example, the plurality of nanostructures 112 may be arranged irregularly. In this case, the micro cavity may not also have a polarization dependency. According to another example embodiment, the arrangement of the plurality of nanostructures 112 may be designed differently from the 4-fold symmetry such that the light emitting device 100 intentionally emits only light of a specific polarization component. For example, the plurality of nanostructures 112 may be arranged in a one-dimensional array pattern.

The planarization layer 120 may be disposed on the reflective layer 110 including the plurality of nanostructures 112 to provide a flat surface with respect to the structures on the planarization layer 120. Therefore, the first electrode 131 disposed on the upper surface of the planarization layer 120 may have a flat lower surface. Then, both the lower and upper surfaces of the first electrode 131 may have flat surfaces, and the organic emission layer 140 and the second electrode 132 disposed thereon may also have flat surfaces. Therefore, the first electrode 131 and the second electrode 132 may apply a uniform electric field to the organic emission layer 140. As a result, the lifespan of the organic emission layer 140 and the light emitting device 100 may increase.

In addition, the planarization layer 120 may be disposed on the upper surface of the nanostructure 112 such that an air gap exists between the plurality of nanostructures 112 of the reflective layer 110. For example, the planarization layer 120 may be disposed to not fill the space 113 between the plurality of nanostructures 112. To this end, the lower surface of the planarization layer 120 may also be formed to be almost flat. In addition, while the planarization layer 120 is disposed on the reflective layer 110, the planarization layer 120 may be formed sufficiently robust such that the surface of the planarization layer 120 is not deformed to be concaved toward the space 113 between the plurality of nanostructures 112.

When the space 113 between the plurality of nanostructures 112 is filled with a metal, semiconductor, or dielectric having a higher refractive index than that of air, the optical gap between the plurality of nanostructures 112 increases by the refractive index of the material filled in the space 113 between the plurality of nanostructures 112. Then, in order to form the period of the plurality of nanostructures 112 to correspond to the designed period, the physical distance between the plurality of nanostructures 112 may need to be reduced in consideration of the refractive index of the material filled in the space 113 between the plurality of nanostructures 112. For example, when an air gap exists between the plurality of nanostructures 112 and the physical period of the plurality of nanostructures 112 is about 150 nm, the physical period of the plurality of nanostructures 112 may be less than 100 nm when a material having a high refractive index is filled in the space 113 between the plurality of nanostructures 112

In order to reduce the physical period of the nanostructure 112, the manufacturing process may be difficult and the manufacturing cost may increase. According to the example embodiment, the planarization layer 120 may be disposed on the upper surface of the nanostructure 112 such that the air gap exists between the plurality of nanostructures 112 of the reflective layer 110, and thus the refractive index of the space 113 between the plurality of nanostructures 112 may remain low. Then, because the period of the plurality of nanostructures 112 may increase, the reflective layer 110 may be formed relatively easily, and thus, the manufacturing cost of the light emitting device 100 may be reduced.

In addition, the planarization layer 120 may be configured to have conductivity. A driving circuit for controlling the operation of the light emitting device 100 may provide a driving signal to the first electrode 131 through the reflective layer 110 having conductivity. To this end, the driving circuit may be connected to the reflective layer 110. However, when the planarization layer 120 disposed between the reflective layer 110 and the first electrode 131 has insulating property, a process of forming a via hole vertically in a partial region of the planarization layer 120 and filling a conductive material in the via hole may be added to electrically connect the reflective layer 110 and the first electrode 131. Due to such an additional process, the manufacturing cost of the light emitting device 100 may increase and the performance of the reflective layer 110 or the planarization layer 120 may deteriorate. Therefore, the planarization layer 120 may be formed to have conductivity, thereby reducing the manufacturing cost of the light-emitting device 100 and preventing or reducing the performance deterioration of the reflective layer 110 or the planarization layer 120.

In addition, the planarization layer 120 may have a transparent property with respect to light generated from the organic emission layer 140. For example, the planarization layer 120 may include a transparent material with respect to visible light. Because the planarization layer 120 is disposed in the micro cavity formed between the reflective layer 110 and the second electrode 132, the planarization layer 120 may be formed to reduce light absorption by the planarization layer 120.

As described above, the planarization layer 120 may have conductivity and may be transparent to visible light. In the process of disposing the planarization layer 120 on the reflective layer 110, the planarization layer 120 does not fill the space 113 between the plurality of nanostructures 112 and is configured to maintain a flat surface state with little deformation even on areas corresponding to the space 113 between the plurality of nanostructures 112.

In general, it may not be easy to satisfy the above requirements of the planarization layer 120 with a single material. For example, when a metal material is used as the planarization layer 120, the metal material easily fills the space 113 between the plurality of nanostructures 112 while forming the planarization layer 120 on the reflective layer 110. In addition, the use of the metal material causes a large loss of light. Meanwhile, graphene having a small thickness has conductivity and light transmittance. However, when graphene having the small thickness is disposed on the reflective layer 110, because the graphene is easily concavely dented toward the space 113 between the plurality of nanostructures 112, the first electrode 131, the organic emission layer 140, and the second electrode 132 disposed on the graphene are difficult to maintain a flat state.

The planarization layer 120 according to the example embodiment may include an organic-inorganic hybrid layer in which graphene, in particular, reduced graphene oxide, is dispersed. For example, the organic-inorganic hybrid layer of the planarization layer 120 may include an organic silicon compound. Such an organic-inorganic hybrid layer may be transparent and flat and provide sufficiently high rigidity. In addition, the reduced graphene oxide dispersed in the organic-inorganic hybrid layer may provide conductivity.

Hereinafter, a process of manufacturing the planarization layer 120 according to the example embodiment will be described.

Figure 5:
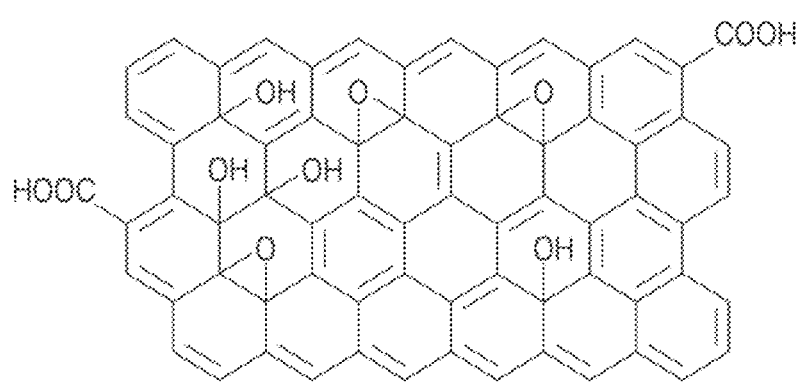
FIG. 5 is a structural formula showing an example of graphene oxide.
Figure 7A:
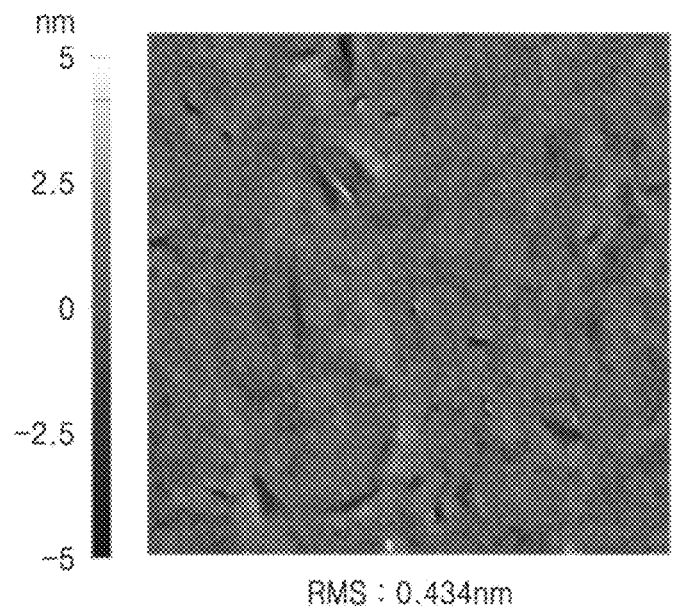
FIGS. 7A, 7B, 7C, 7D, and 7E are diagrams showing measurement results of the surface roughness of a planarization layer according to the content of graphene oxide.
Figure 7B:
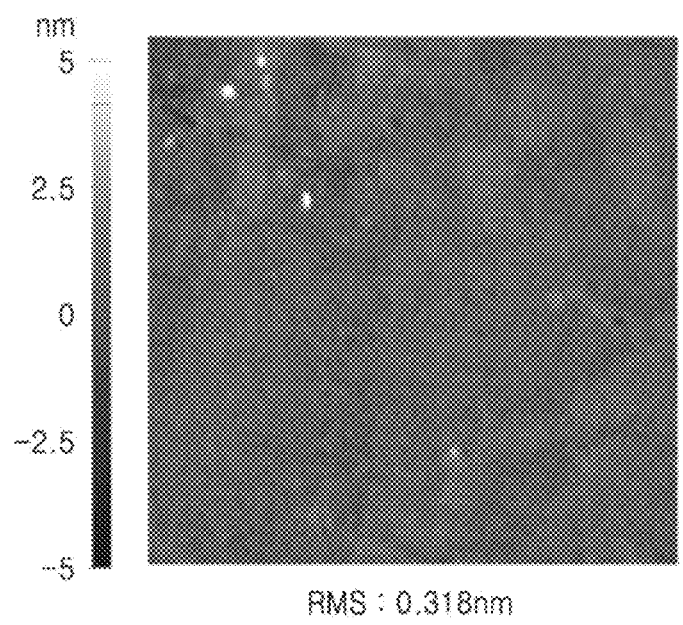
Figure 7C:
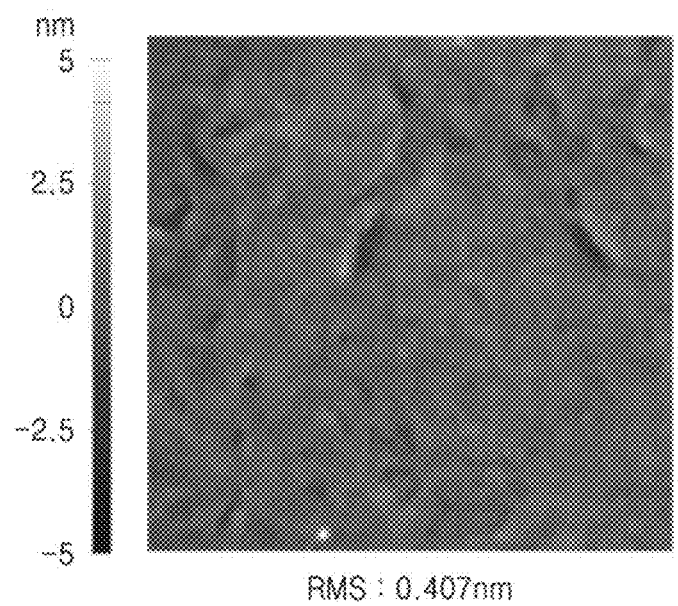
Figure 7D:
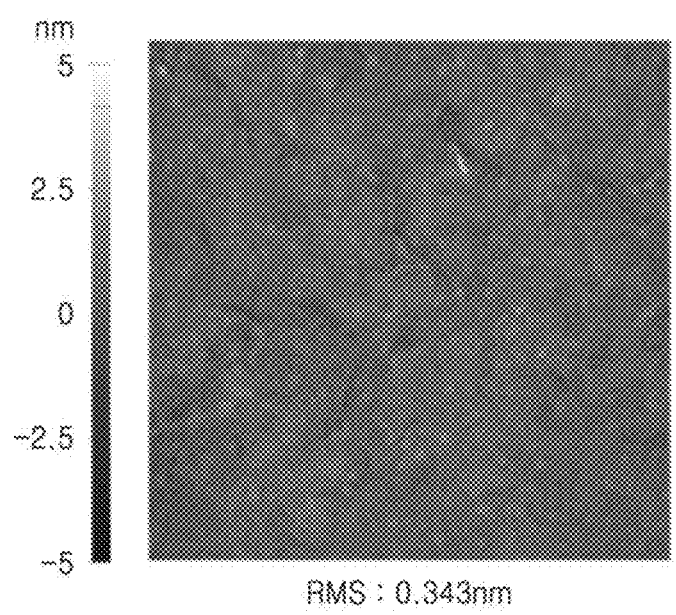
Figure 7E:
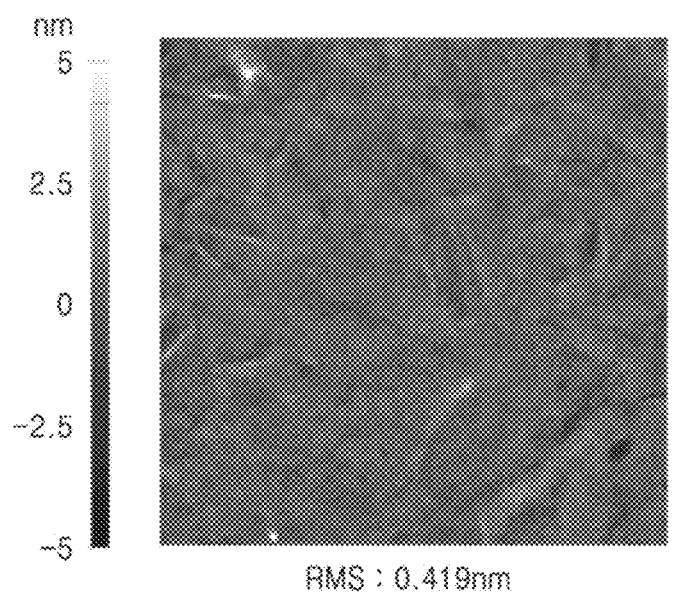
Figure 8A:
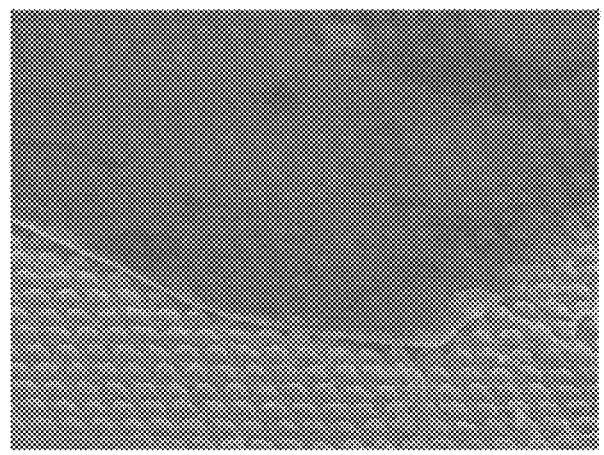
FIGS. 8A, 8B, 8C, 8D, 8E, and 8F are scanning electron microscope (SEM) images showing planarization layer transferred onto a reflective layer.
Figure 8B:
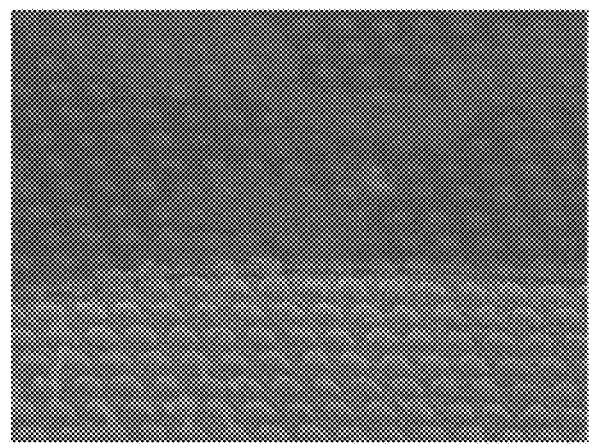
Figure 8C:
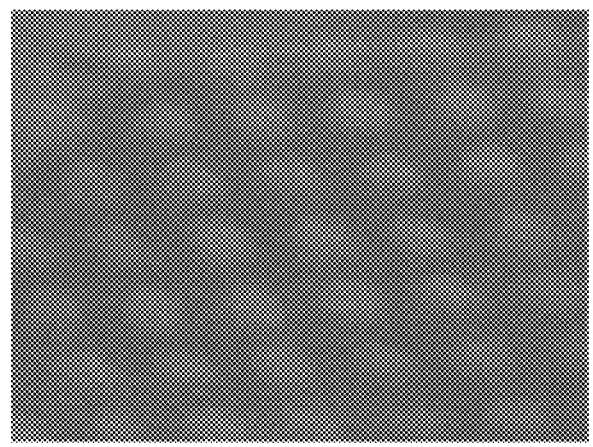
Figure 8D:
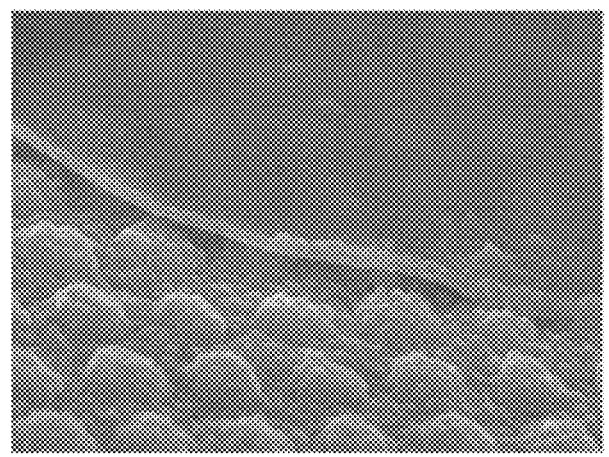
Figure 8E:
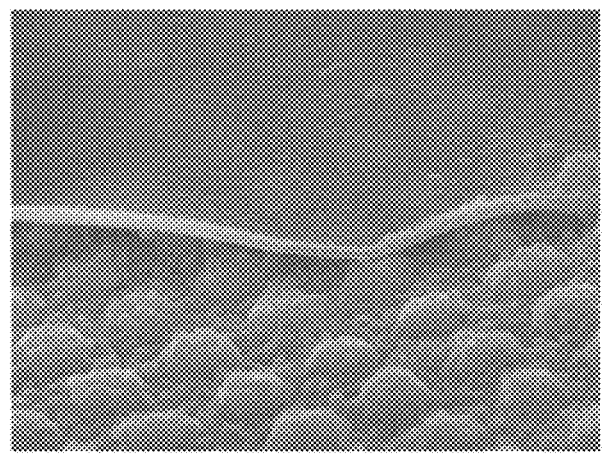
Figure 8F:
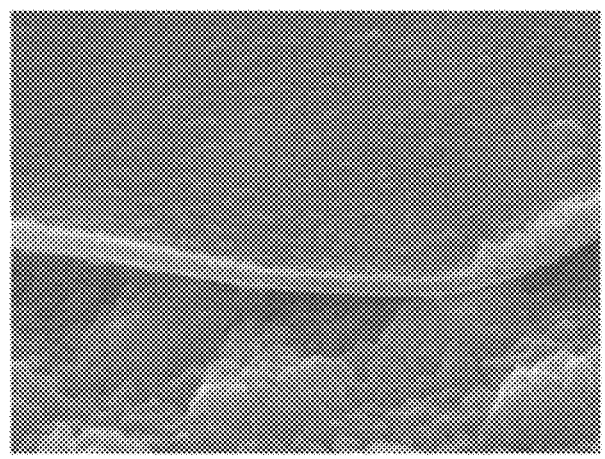

First, graphene oxide (GO) is dispersed in de-ionized (DI) water and ions contained in the graphene oxide solution are removed through dialysis. When compared with graphene oxide, graphene by itself is not easily dispersed in water. FIG. 5 is a structural formula showing an example of graphene oxide. As shown in FIG. 5, graphene oxide has a configuration in which an oxygen atom is bonded to a carbon atom and/or a carboxyl group (—COOH) or a hydroxyl group (—OH) is further bonded to a carbon atom. Graphene oxide may be easily dispersed in water due to the oxygen atom, the carboxyl group, or the hydroxyl group bonded to the carbon atom of graphene oxide.

Then, a solution in which graphene oxide is dispersed and tetramethyl orthosilicate (TMOS) sol are mixed together with a solvent to react. For example, the solvent may be ethanol. In addition, an acidic solution such as hydrochloric acid (HCl) may be further mixed as a reaction catalyst. The ratio of the solution in which graphene oxide is dispersed, the solvent, and the TMOS may be, for example, 1:1:0.1.

TMOS has a structure in which four oxygen atoms are bonded to one silicon atom, and a methyl group (—CH3) is bonded to each oxygen atom. Such TMOS is hydrolyzed in a solvent to have a structure in which a hydroxyl group is bonded to each silicon atom, and hydrolyzed TMOS may be bonded to the surface of graphene oxide. After reacting at room temperature for about 1 day, a mixture of graphene oxide and TMOS sol in the solvent may be coated on a hydrophilic substrate. For example, the mixture may be coated on a $SiO_2$/Si substrate using a spin coating method.

Thereafter, the solvent in the mixture is removed by baking the mixture in a chamber. After removing the solvent, for example, the mixture coated on the substrate is cured by heating the mixture at a temperature of about 400° C. in the nitrogen ($N_2$) atmosphere. In this process, a polymer silica hybrid layer is formed through a condensation reaction.

Finally, graphene oxide is reduced to reduced graphene oxide by annealing the cured mixture, and thus the planarization layer 120 may be formed. For example, annealing may be performed at a temperature of about 1000° C. in the hydrogen ($H_2$) and nitrogen ($N_2$) atmosphere. Then, the oxygen atom, the carboxyl group, or the hydroxyl group bonded to the carbon atom of graphene oxide shown in FIG. 5 may be removed. Accordingly, reduced graphene oxide having conductivity is dispersed and distributed in the polymer silica hybrid layer. Therefore, the planarization layer 120 may be the polymer silica hybrid layer in which reduced graphene oxide is dispersed and distributed. The planarization layer 120 formed as described above may be removed from the hydrophilic substrate and transferred to and disposed on the reflective layer 110.

In order to confirm various characteristics of the planarization layer 120 formed as described above, a plurality of planarization layers 120 are formed by varying the concentration of graphene oxide. For example, FIG. 6 is a table showing an example of various combinations of materials for manufacturing the planarization layer 120. As shown in the table of FIG. 6, the planarization layer 120 is actually formed by variously selecting the proportion of graphene oxide compared to TMOS to about 2 wt %, 4 wt %, 6 wt %, 8 wt %, and 10 wt % using the above-described method.

The planarization layer 120 is formed to have a uniform thickness of about 40 nm as a whole. In the actual light emitting device 100, the thickness of the planarization layer 120 does not exceed about 50 nm. When the thickness of the planarization layer 120 is extremely great, the thickness of the organic emission layer 140 needs to be reduced, which may cause deterioration of the emission efficiency and brightness of the light emitting device 100. For example, the thickness of the planarization layer 120 may be in the range of about 10 nm to about 50 nm.

FIGS. 7A to 7E are diagrams showing measurement results of the surface roughness of the planarization layer 120 according to the content of graphene oxide. FIGS. 7A to 7E illustrate that because when the proportion of graphene oxide compared to TMOS is 2 wt %, 4 wt %, 6 wt %, 8 wt %, and 10 wt %, the root mean square (RMS) surface roughness of the planarization layer 120 is about 0.434 nm, about 0.318 nm, about 0.407 nm, about 0.343 nm, about 0.419 nm, respectively the surface roughness of the formed planarization layer 120 is very high. Accordingly, the planarization layer 120 according to the example embodiment may provide a very flat surface to the first electrode 131, the organic emission layer 140, and the second electrode 132 disposed thereon. Although the surface roughness of the planarization layer 120 may vary depending on the thickness of the formed planarization layer 120, the surface roughness of the planarization layer 120 may be less than 1 nm RMS. For example, the surface roughness of the planarization layer 120 may be in the range of about 0.3 nm RMS to about 0.5 nm RMS.

FIGS. 8A to 8F are scanning electron microscope (SEM) images showing the planarization layer 120 transferred onto the reflective layer 110 which are obtained with respect to various positions of the planarization layer 120 at various magnifications. The planarization layer 120 is transferred onto only a partial region of the reflective layer 110 to not cover the entire region of the reflective layer 110. FIGS. 8A to 8F illustrate that the planarization layer 120 transferred onto the reflective layer 110 provides a very flat surface. In addition, the edge of the transferred planarization layer 120 that is the space 113 between the plurality of nanostructures 112 of the reflective layer 110 is not filled by the planarization layer 120 and has an air gap. In addition, the planarization layer 120 is not concavely recessed in the space 113 between the plurality of nanostructures 112 of the reflective layer 110 and maintains a flat surface state.

Figure 9:
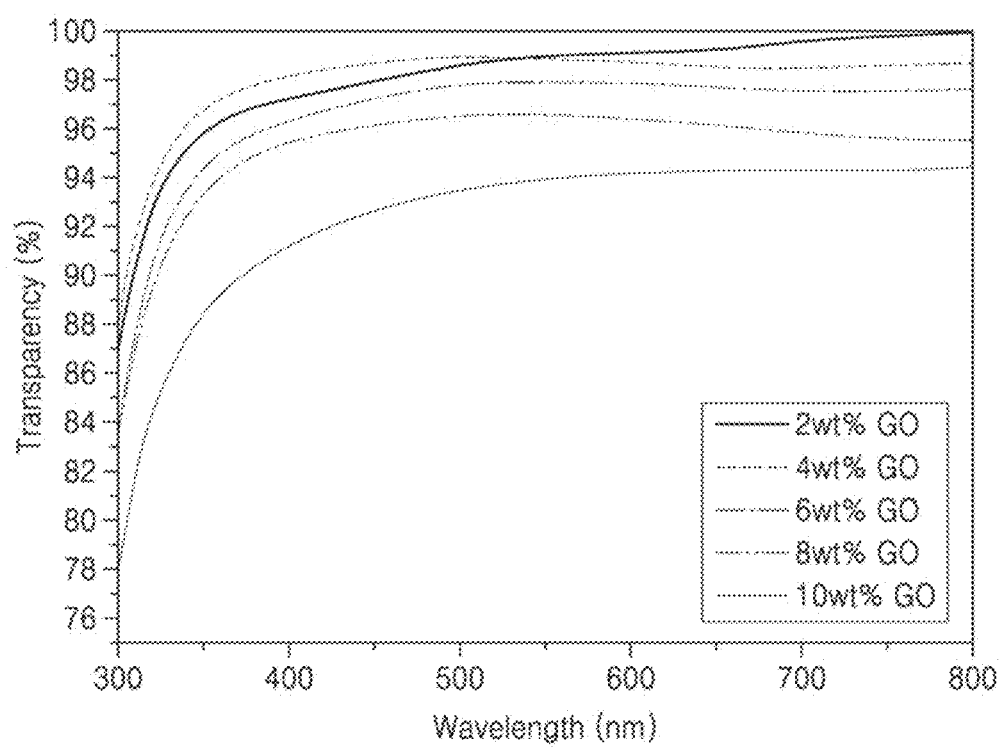
FIG. 9 is a graph showing the relationship between the wavelength of incidence light and the transmittance of a planarization layer with respect to various contents of graphene oxide.

FIG. 9 is a graph showing the relationship between the wavelength of incidence light and the transmittance of the planarization layer 120 with respect to various contents of graphene oxide. In the graph of FIG. 9, the transmittance is relative to a glass substrate. For example, in the graph of FIG. 9, transmittance of 100% indicates that the transmittance is the same as that of the glass substrate, and transmittance of 80% indicates 80% of the transmittance of the glass substrate. FIG. 9 illustrates that the planarization layer 120 has a relatively low transmittance with respect to light in an ultraviolet ray region and a relatively high transmittance with respect to light in a visible light region regardless of the content of graphene oxide. In particular, the lower the content of graphene oxide, the higher the transmittance of the planarization layer 120. For example, when the proportion of graphene oxide compared to TMOS is about 2 wt %, the transmittance of the planarization layer 120 is almost the same as that of the glass substrate. In addition, even when the proportion of graphene oxide compared to TMOS is about 10 wt %, the transmittance of the planarization layer 120 may maintain 90% or more of the transmittance of the glass substrate.

Figure 10:
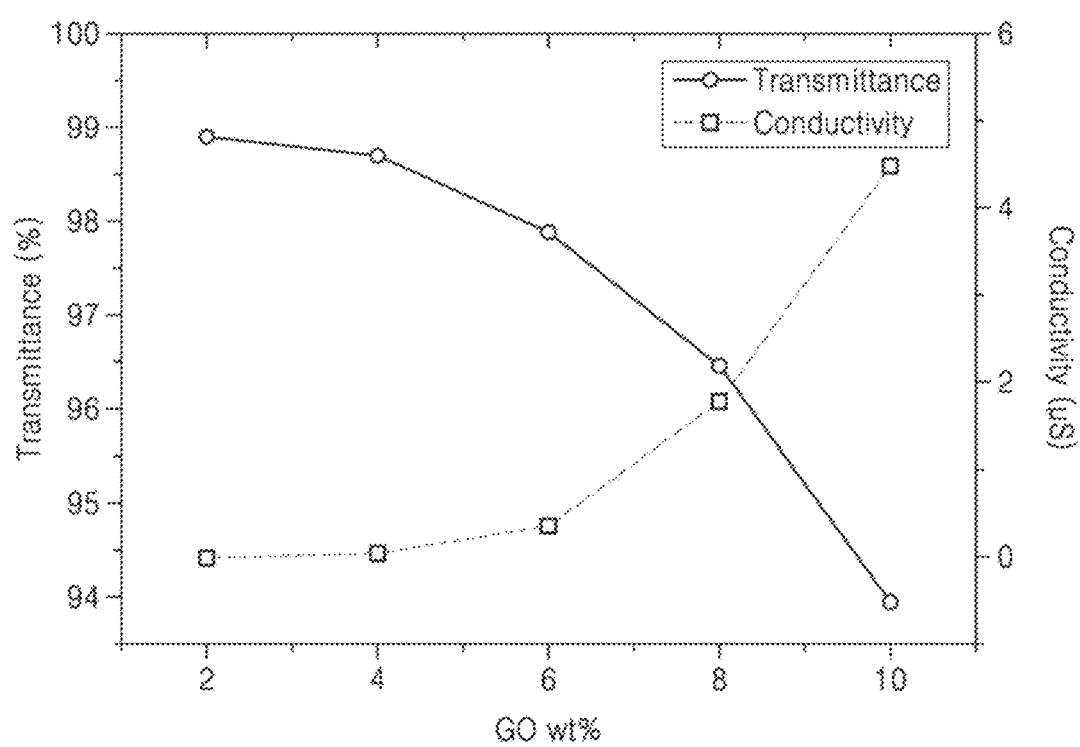
FIG. 10 is a graph showing changes in the electrical conductivity and the transmittance of a planarization layer according to the content of graphene oxide.

FIG. 10 is a graph showing changes in the electrical conductivity and the transmittance of the planarization layer 120 according to the content of graphene oxide. Referring to FIG. 10, as the proportion of graphene oxide compared to TMOS increases, the electrical conductivity of the planarization layer 120 increases, but the transmittance thereof decreases. In addition, as the proportion of graphene oxide compared to TMOS decreases, the electrical conductivity of the planarization layer 120 decreases, but the transmittance thereof increases.

Figure 11:
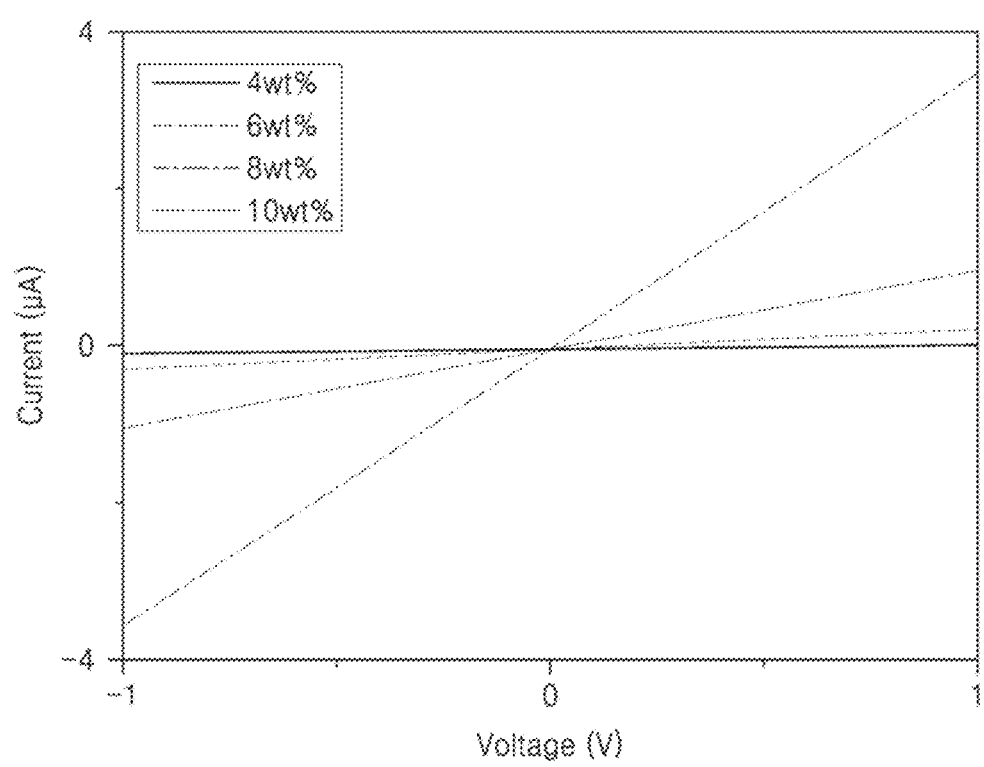
FIG. 11 is a graph showing the current-voltage behavior of a planarization layer according to the content of graphene oxide.

FIG. 11 is a graph showing the current-voltage behavior of the planarization layer 120 according to the content of graphene oxide. The graph of FIG. 11 illustrates that the planarization layer 120 exhibits a very linear current-voltage behavior regardless of the content of graphene oxide. In addition, as the content of graphene oxide increases, the resistance of the planarization layer 120 decreases and the electrical conductivity thereof increases.

As described above, in all cases where the proportion of graphene oxide compared to TMOS is 2 wt %, 4 wt %, 6 wt %, 8 wt %, and 10 wt %, the planarization layer 120 has sufficient electrical conductivity and transmittance. However, when the proportion of graphene oxide compared to TMOS is too low, the electrical conductivity of the planarization layer 120 may be less than a reference value of the electrical conductivity, and when the proportion of graphene oxide compared to TMOS is too high, the transmittance of the planarization layer 120 may be less than a reference value of the transmittance. In addition, the proportion of reduced graphene oxide dispersed in the finally formed planarization layer 120 may be directly determined by the proportion of graphene oxide compared to TMOS. In consideration of this point, the proportion of reduced graphene oxide dispersed in the planarization layer 120 may be selected within the range of about 1.5 wt % to about 15 wt %.

Figure 12:
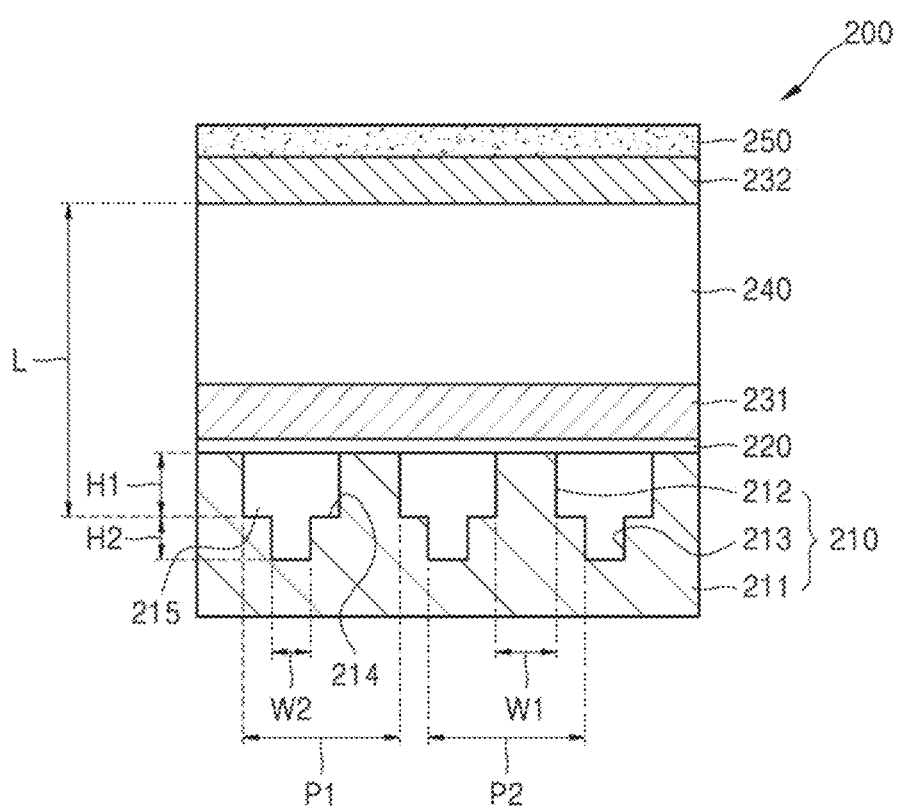
FIG. 12 is a cross-sectional view schematically showing a structure of a light emitting device according to another example embodiment.

FIG. 12 is a cross-sectional view schematically showing a structure of a light emitting device 200 according to another example embodiment. Referring to FIG. 12, the light emitting device 200 according to another example embodiment may include a reflective layer 210 including a phase modulation surface, a planarization layer 220 disposed on the reflective layer 210, a first electrode 231 disposed on the planarization layer 220, an organic emission layer 240 disposed on the first electrode 231, and a second electrode 232 disposed on the organic emission layer 240. In addition, the light emitting device 200 may further include a transparent passivation layer 250 disposed on the second electrode 232. Compared with the light emitting device 100 shown in FIG. 1, the structure of the phase modulation surface formed on the reflective layer 210 of the light emitting device 200 shown in FIG. 12 is different from the structure of a phase modulation surface of the light emitting device 100 shown in FIG. 1. The remaining configuration of the light emitting device 200 illustrated in FIG. 12 is the same as that of the light emitting device 100 illustrated in FIG. 1, and thus descriptions thereof will be omitted.

Figure 13:
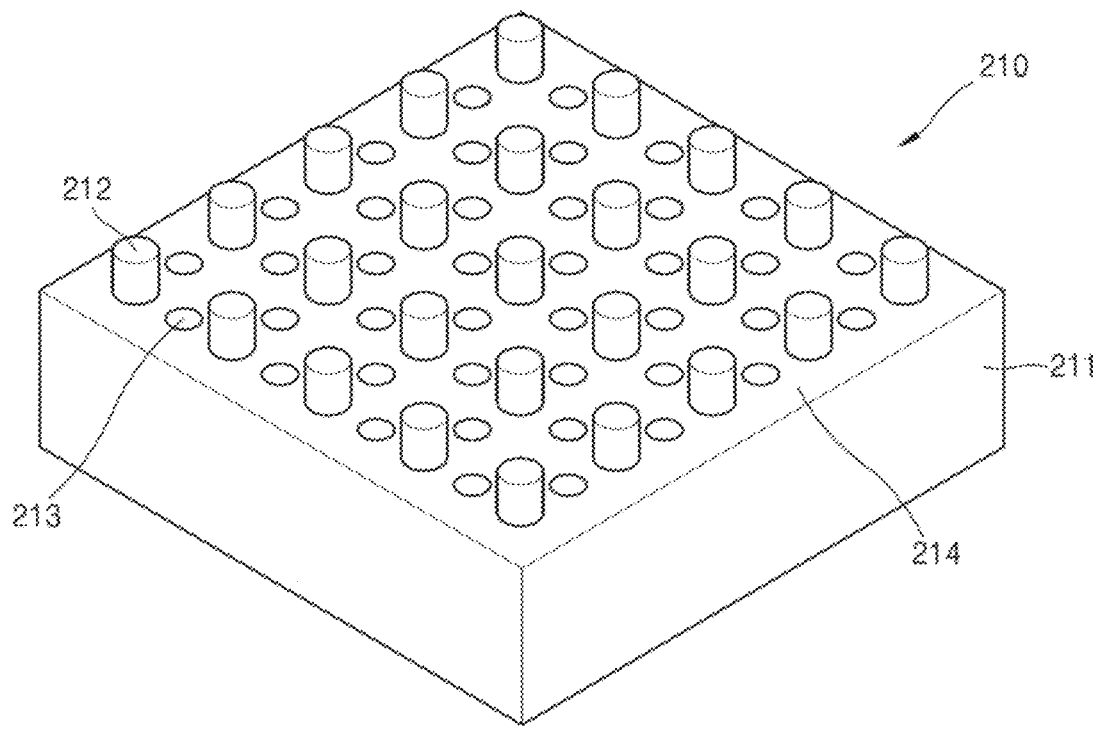
FIG. 13 is a perspective view schematically showing an example structure of a reflective layer illustrated in FIG. 12.
Figure 14:
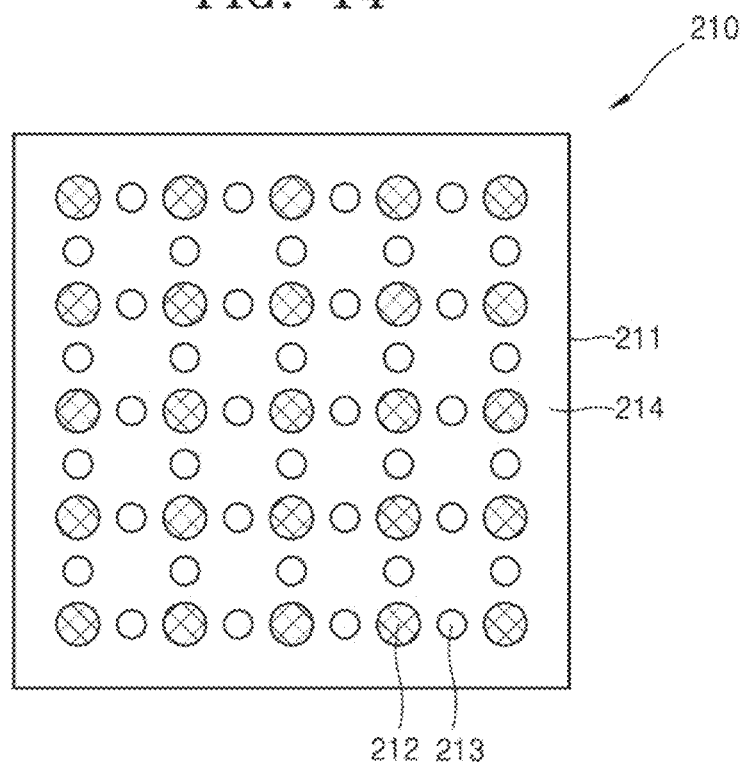
FIG. 14 is a plan view schematically showing an example structure of the reflective layer illustrated in FIG. 12.

FIG. 13 is a perspective view schematically showing an example structure of the reflective layer 210 illustrated in FIG. 12, and FIG. 14 is a plan view schematically showing an example structure of the reflective layer 210 illustrated in FIG. 12. Referring to FIGS. 12 to 14, the phase modulation surface may include a plurality of nanostructures 212 protruding and periodically disposed on an upper surface 214 of a base 211 facing the first electrode 231 and a plurality of recesses 213 concaved in the upper surface 214 of the base 211. The upper surface of the plurality of nanostructures 212 may be in contact with the planarization layer 220, and an air gap exists in a space 215 between the plurality of nanostructures 212.

Each of the nanostructures 212 protruding from the upper surface 214 of the base 211 and each of the recesses 213 recessed from the upper surface 214 of the base 211 may have dimensions smaller than the wavelength of visible light. As shown in FIGS. 13 and 14, the nanostructures 212 and the recesses 213 may be formed to be spaced apart, and an area occupied by the upper surface 214 may be greater than an area occupied by the plurality of nanostructures 212 or the plurality of recesses 213. In addition, the area occupied by each of the nanostructures 212 may be greater than or equal to the area occupied by each of the recesses 213.

The plurality of nanostructures 212 may be periodically arranged with a predetermined pitch P1 on the upper surface 214 of the base 211. FIG. 14 shows an example of the nanostructures 212 periodically arranged in the shape of a square array. However, this is merely an example, and in addition, the plurality of nanostructures 212 may be arranged in an array of various other shapes such as a regular triangle, a regular hexagon, etc. Each of the nanostructures 212 may have, for example, a diameter W1 of about 300 nm or less. However, each of the nanostructures 212 is not necessarily limited thereto. For example, each of the nanostructures 212 may have the diameter W1 of about 30 nm to 250 nm. Further, each of the nanostructures 212 may have, for example, a height H1 of about 100 nm or less. However, these numerical values are only examples, and embodiments are not limited thereto.

As described above, the plurality of nanostructures 212 may serve to adjust the optical length L of the micro cavity to resonate light corresponding to the emitting wavelength of the light emitting device 200. In other words, when the resonance wavelength of the micro cavity is $\lambda$, the diameter W1 and the height H1 of each of the nanostructures 212 of the phase modulation surface and the pitch P1 of the nanostructures 212 may be selected such that the optical length L of the micro cavity satisfies $n\lambda/2$, where n is a natural number.

The plurality of recesses 213 may be formed at a predetermined depth H2 on the upper surface 214 of the base 211. The plurality of recesses 213 may be periodically two-dimensionally arranged with a predetermined pitch P2 between the plurality of nanostructures 212. FIGS. 13 and 14 show examples of each of the recesses 213 disposed between the two adjacent nanostructures 212. Each of the recesses 213 may be formed in a cylindrical shape. Each of the recesses 213 may have, for example, a diameter W2 of approximately 250 nm or less. More specifically, for example, each of the recesses 213 may have a diameter W2 of about 80 nm to 250 nm, but is not limited thereto. Further, each of the recesses 213 may have, for example, a depth H2 of about 100 nm or less but this is merely an example. In addition, a difference between the diameter W1 of each of the nanostructures 212 and the diameter W2 of each of the recesses 213 may be, for example, about 100 nm or less, but is not limited thereto.

Figure 15A:
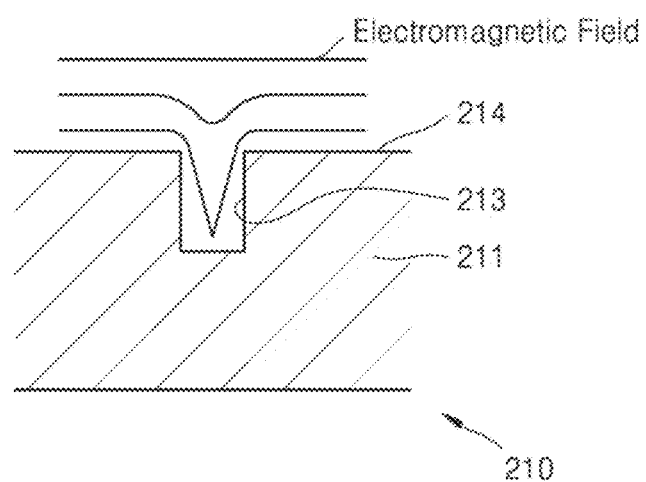
FIG. 15A schematically shows light of a short wavelength flowing into a recess formed in a reflective layer.
Figure 15B:
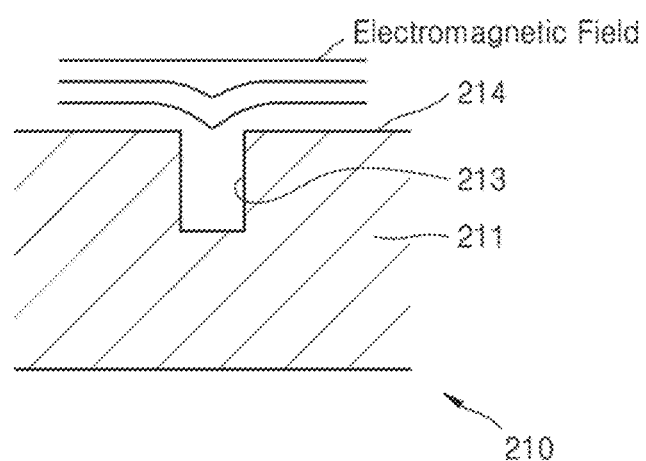
FIG. 15B schematically shows light of a long wavelength blocked in the reflective layer in which the recess is formed.

The plurality of the recesses 213 may serve to absorb light of a wavelength of which resonance is not desired within the micro cavity. FIG. 15A schematically shows light of a short wavelength flowing into the recess 213 formed in the reflective layer 210, and FIG. 15B schematically shows light of a long wavelength blocked in the reflective layer 210 in which the recess 213 is formed. It may be seen that as shown in FIG. 15A, the light of the short wavelength flows into and is absorbed in the nano-sized recess 213 formed in the upper surface 214 of the base 211, whereas, as shown in FIG. 15B, the light of the long wavelength does not flow into the recess 213 and is reflected from the upper surface 214 of the base 211.

The wavelength of the light absorbed into the recess 213 formed in the reflective layer 210 may vary according to the size of the recess 213. For example, when the nanostructures 212 are not considered, the recess 213 having a diameter of about 190 nm formed on the surface of the flat reflective layer 210 including silver (Ag) may absorb blue light of a wavelength of 450 nm, and the recess 213 having a diameter of about 244 nm may absorb green light of a wavelength of 550 nm.

For example, in the light emitting device 200 configured to emit red light, when the optical length L of the micro cavity is selected as 630 nm, part of light of a wavelength of 420 nm may cause a third resonance to be emitted from the light emitting device 200. Then, because blue light is emitted from the light emitting device 200 together with red light, the color purity of light emitted from the light emitting device 200 may be reduced. In the example embodiment, the light of the wavelength of which resonance is not desired may be additionally absorbed by the recess 213 by forming the plurality of nano-sized recesses 213 along with the plurality of nanostructures 212 on the phase modulation surface of the reflective layer 210. Therefore, the color purity of the light emitting device 200 may be further improved.

Figure 16:
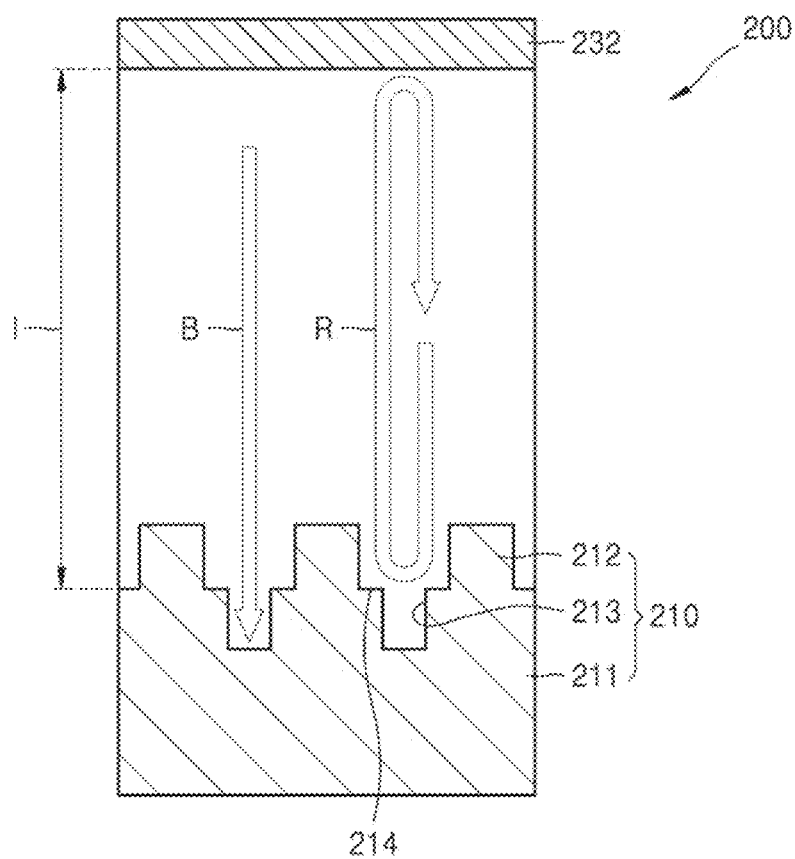
FIG. 16 schematically shows light resonating in a light emitting device according to an example embodiment.

FIG. 16 schematically shows light resonating in the light emitting device 200 according to an example embodiment. In FIG. 16, a red light emitting device is illustrated as the light emitting device 200 as an example, and for convenience, only the reflective layer 210 and the second electrode 232 constituting the micro cavity are illustrated. Referring to FIG. 16, in the micro cavity, a red light R may not flow into the recess 213 formed in the surface of the reflective layer 210 but may be reflected from the surface of the reflective layer 210. However, a blue light B having a wavelength shorter than the red light R flows into and is absorbed in the recess 213 formed in the surface of the reflective layer 210. As described above, each of the recesses 213 may have, for example, a diameter of about 250 nm or less. Accordingly, in the micro cavity, only the red light R may resonate and be emitted outside the light emitting device 200.

In FIG. 16, the example in which the light emitting device 200 according to the example embodiment is the red light emitting device is described. However, embodiments are not limited thereto. For example, the light emitting device 200 according to the example embodiment may be a green light emitting device. In general, in a case where the surface of a reflective layer has a flat structure, when a second resonance of a green light occurs in a micro cavity, a third resonance of an ultraviolet light occurs, which does not affect a display apparatus in a visible light region. However, when the reflective layer 210 having the phase modulation surface is used, there is a possibility that a third resonance of the blue light B occurs in the micro cavity due to the phase modulation. Accordingly, blue light of an unwanted short wavelength in the green light emitting device may be emitted. Therefore, even when the light emitting device 200 is the green light emitting device, the unwanted emission of the blue light may be suppressed by forming the plurality of recesses 213 in the surface of the reflective layer 210.

Figure 17:
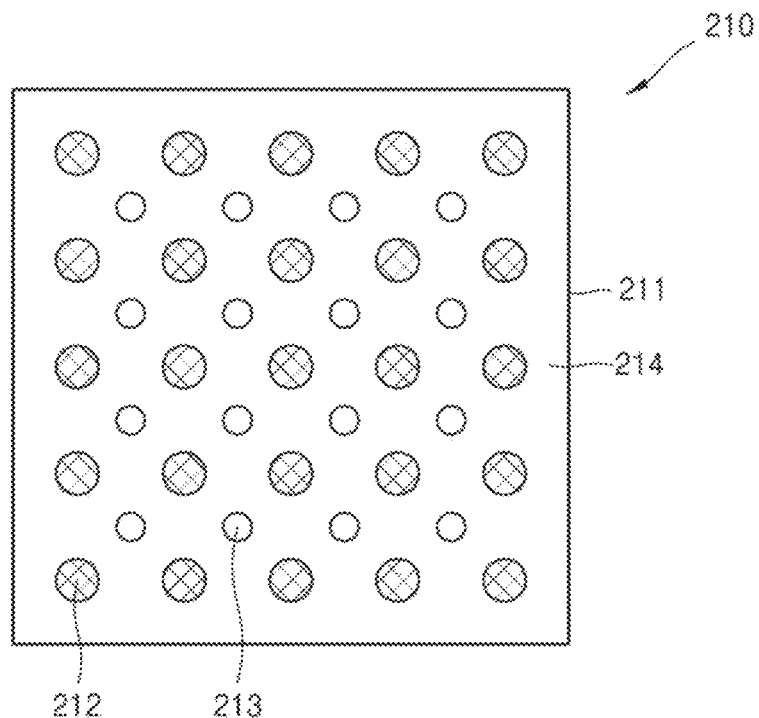
FIG. 17 is a plan view schematically showing another example structure of the reflective layer shown in FIG. 12.

FIG. 17 is a plan view schematically showing another example structure of the reflective layer 210 shown in FIG. 12. In the example embodiment shown in FIGS. 13 and 14, the nanostructures 212 are periodically arranged in a square array, and each of the recesses 213 may be formed between the two adjacent nanostructures 212. In the reflective layer 210 shown in FIG. 17, the nanostructures 212 protruding from the upper surface 214 of the base 211 may be periodically arranged in the square array, and the recesses 213 may be arranged between the two nanostructures 212 arranged adjacent to each other in a diagonal direction on the upper surface 214 of the base 211 at a predetermined depth. For example, each of the recesses 213 may be disposed in the center of a unit array of a square shape including the four adjacent nanostructures 212. However, this is merely an example, and the nanostructures 212 and the recesses 213 may be arranged in various other shapes.

Figure 18:
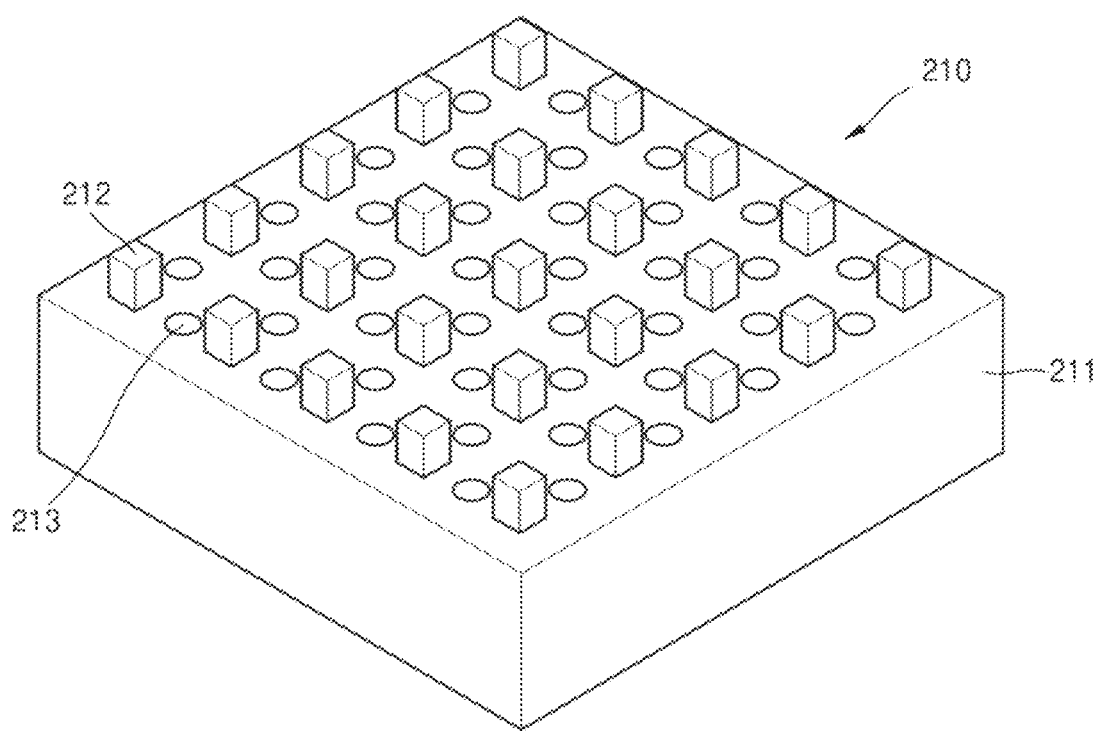
FIG. 18 is a perspective view schematically showing another example structure of the reflective layer shown in FIG. 12.

In addition, FIG. 18 is a perspective view schematically showing another example structure of the reflective layer 210 shown in FIG. 12. In the example embodiment shown in FIGS. 13 and 14, the nanostructures 212 have a cylindrical shape and the recesses 213 are formed in a cylindrical shape. In the metal reflective layer 210 shown in FIG. 18, the nanostructures 212 have a square column shape. In this example, the maximum width of the nanostructure 212 may correspond to the diameter. In addition, the recesses 213 may be formed in the cylindrical shape between the two adjacent nanostructures 212. However, this is merely an example, and each of the nanostructures 212 may have a variety of other polyprism shapes, such as a triangular column or a pentagonal column. In addition, each of the recesses 213 may also be formed in various other shape.

Figure 19:
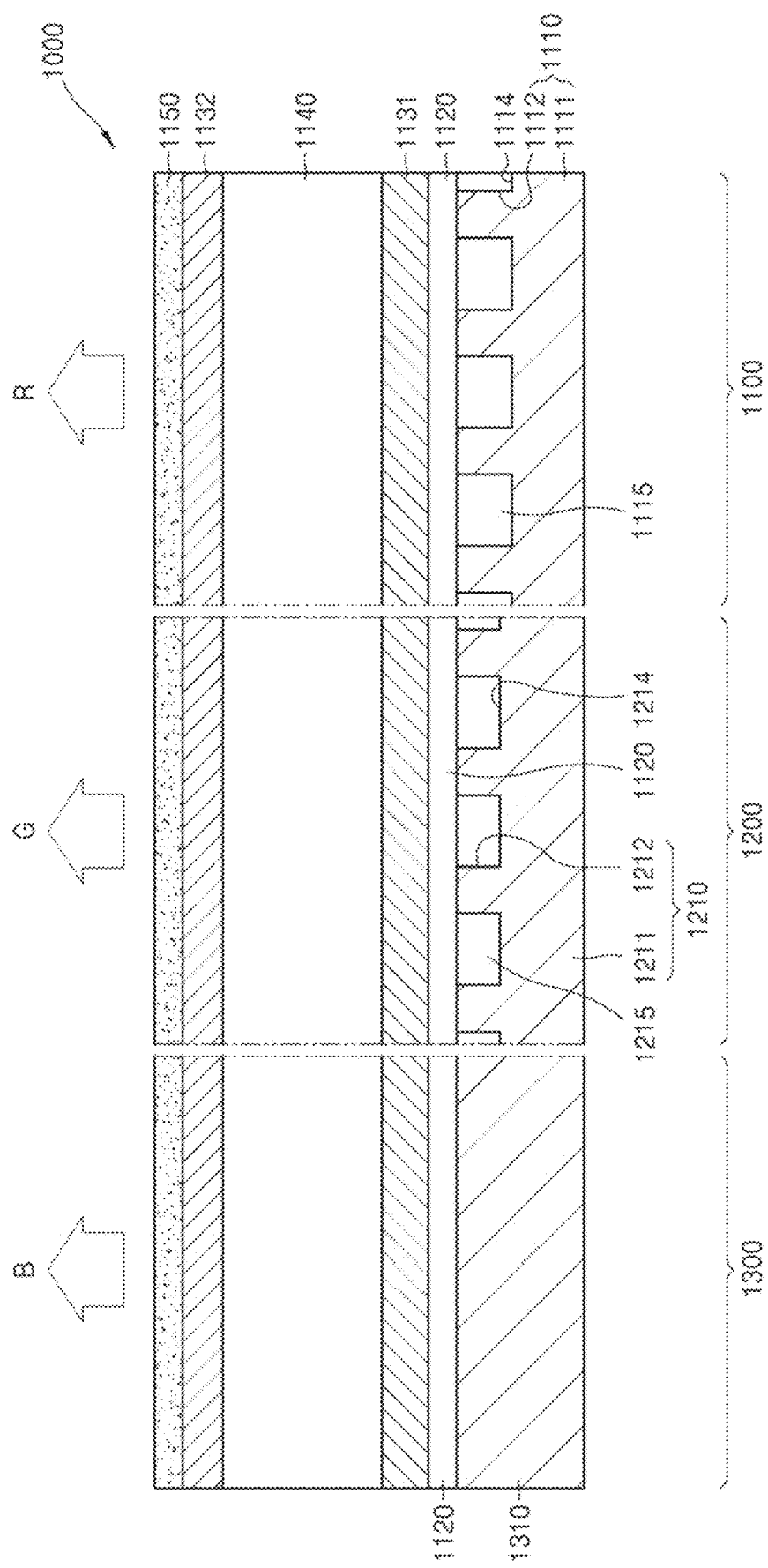
FIG. 19 is a cross-sectional view schematically showing a structure of a display apparatus according to an example embodiment.

The above-described light emitting devices 100 and 200 may be applied to a plurality of pixels of a display apparatus. FIG. 19 is a cross-sectional view schematically showing a structure of a display apparatus 1000 according to an example embodiment. Referring to FIG. 19, the display apparatus 1000 may include a plurality of pixels that emit light of different colors. Here, the plurality of pixels may include red, green, and blue pixels 1100, 1200, and 1300 disposed adjacent to each other on the same plane of a substrate. As an example, only one unit pixel including the red, green, and blue pixels 1100, 1200, and 1300 is illustrated.

The red pixel 1100 may have the same structure as the light emitting device 100 illustrated in FIG. 1. The red pixel 1100 may include a first reflective layer 1110 including a first phase modulation surface, a first planarization layer 1120 disposed on the first reflective layer 1110, a first electrode 1131 disposed on the first planarization layer 1120, an organic emission layer 1140 disposed on the first electrode 1131, and a second electrode 1132 disposed on the organic emission layer 1140. The red pixel 1100 may further include a transparent passivation layer 1150 disposed on the second electrode 1132. The first reflective layer 1110 may include a plurality of first nanostructures 1112 formed to protrude on an upper surface 1114 of a base 1111. The first reflective layer 1110 may form a first micro cavity that resonates the red light R together with the second electrode 1132. In addition, upper surfaces of the plurality of first nanostructures 1112 may be in contact with the planarization layer 1120, and an air gap exists in a space 1115 between the plurality of first nanostructures 1112.

The green pixel 1200 may have the same structure as the light emitting device 100 shown in FIG. 1. The green pixel 1200 may include a second reflective layer 1210 including a second phase modulation surface, a second planarization layer 1220 disposed on the second reflective layer 1210, the first electrode 1131 disposed on the second planarization layer 1220, the organic emission layer 1140 disposed on the first electrode 1131, the second electrode 1132 disposed on the organic emission layer 1140, and the passivation layer 1150 disposed on the second electrode 1132. The second reflective layer 1210 may include a plurality of second nanostructures 1212 formed to protrude over an upper surface 1214 of a base 1211. The second reflective layer 1210 may form a second micro cavity that resonates the green light G together with the second electrode 1132. In addition, upper surfaces of the plurality of second nanostructures 1212 may be in contact with the planarization layer 1120, and an air gap exists in a space 1215 between the plurality of second nanostructures 1212.

In addition, the blue pixel 1300 may include a third reflective layer 1310, a third planarization layer 1320 disposed on the third reflective layer 1310, a first electrode 1131 disposed on the third planarization layer 1320, the organic emission layer 1140 disposed on the first electrode 1131, the second electrode 1132 disposed on the organic emission layer 1140, and the passivation layer 1150 disposed on the second electrode 1132. The upper surface of the third reflective layer 1310 in the blue pixel 1300 may include a flat reflective surface. The third reflective layer 1310 may form a third micro cavity that resonates blue light together with the second electrode 1132. The third micro cavity may have a resonance wavelength of the blue light B by adjusting structural and optical characteristics of the layers disposed between the third reflective layer 1310 and the second electrode 1132. Here, the upper surface of the third reflective layer 1310 may be formed at the same height as the upper surfaces of the first and second nanostructures 1112 and 1212.

Figure 20:
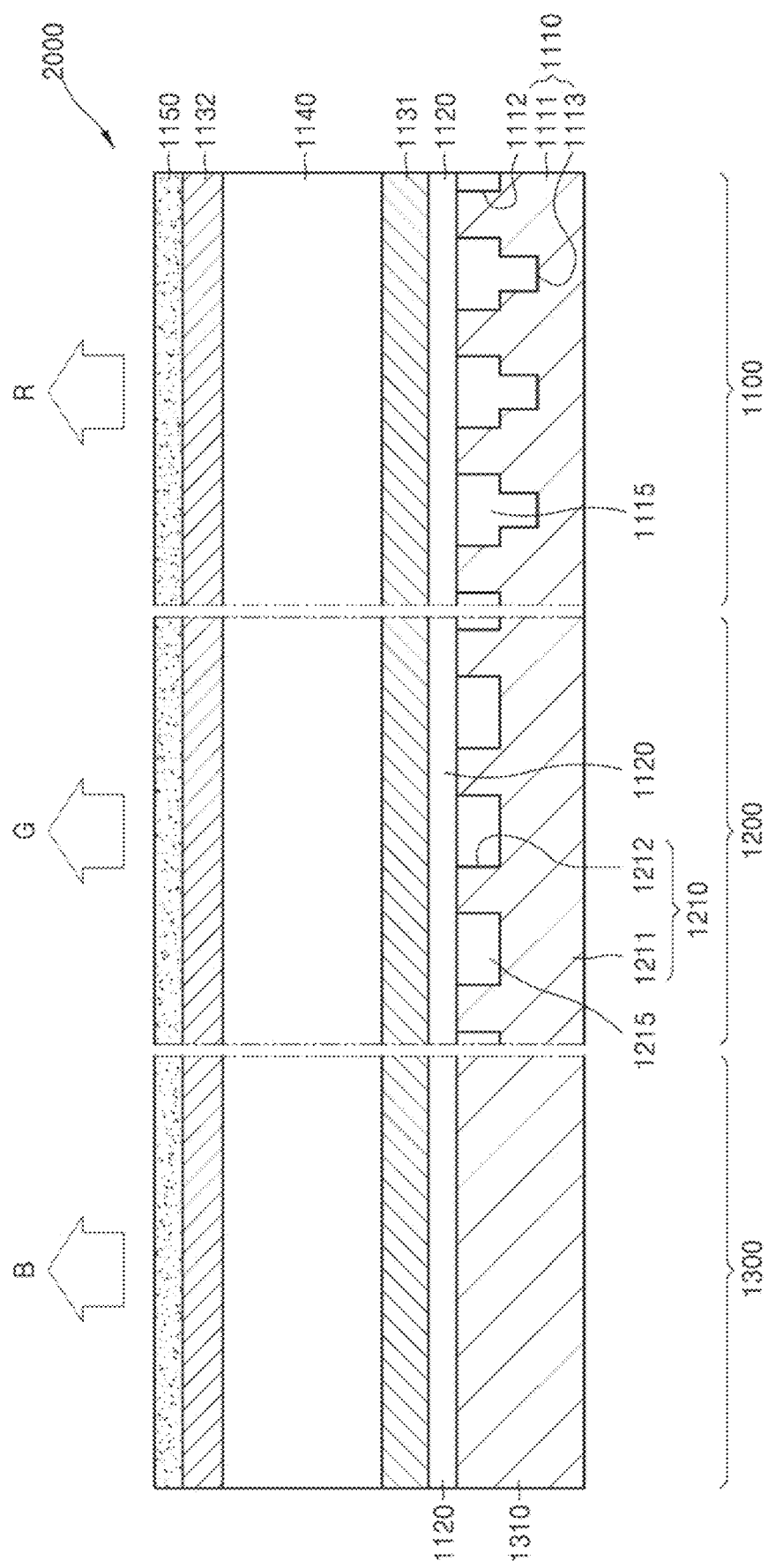
FIG. 20 is a cross-sectional view schematically showing a structure of a display apparatus according to another example embodiment.

FIG. 20 is a cross-sectional view schematically showing a structure of a display apparatus 2000 according to another example embodiment. Referring to FIG. 20, the first reflective layer 1110 of the red pixel 1100 of the display apparatus 2000 may further include a plurality of first recesses 1113 that absorb the blue light B. Although the second reflective layer 1210 of the green pixel 1200 includes only the second nanostructure 1212, the second reflective layer 1210 of the green pixel 1200 also may further include a plurality of second recesses for absorbing blue light B.

In the display apparatuses 1000 and 2000 illustrated in FIGS. 19 and 20, the planarization layer 1120 forms an air gap in the space 1115 between the plurality of first nanostructures 1112 and the space 1215 between the plurality of second nanostructures 1212, there is no need to manufacture the first and second nanostructures 1112 and 1212 with a period of 100 nm or less. Accordingly, manufacturing of the display apparatuses 1000 and 2000 may be more easy and manufacturing cost may be reduced.

The above-described light emitting device and display device may be applied without limitation to devices of various sizes and various uses. For example, the above-described light emitting device and display apparatus may be applied to a display panel of a mobile phone or a smart phone, may be applied to a display panel of a tablet or smart tablet, may be applied to a display panel of a notebook computer, television, or smart television, or may be applied to a small display panel used in a head mounted display, a glasses type display, a goggle type display, or the like.

While the light emitting device, the method of manufacturing the light emitting device and the display apparatus including the light emitting device are described according to example embodiments with reference to the accompanying drawings, it should be understood that example embodiments described herein should be considered in a descriptive sense only and not for purposes of limitation. Descriptions of features or aspects within each example embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A light emitting device comprising:
a reflective layer comprising a plurality of nanostructures that are periodically two-dimensionally arranged;
a planarization layer disposed on the reflective layer;
a first electrode disposed on the planarization layer;
an organic emission layer disposed on the first electrode; and
a second electrode disposed on the organic emission layer,
wherein the planarization layer comprises a conductive material that is transparent with respect to light emitted by the organic emission layer,
wherein the planarization layer is disposed on upper surfaces of the plurality of nanostructures such that an air gap is provided between adjacent nanostructures of the plurality of nanostructures, and
wherein the planarization layer further comprises an organic-inorganic hybrid layer in which reduced graphene oxide is dispersed.

2. The light emitting device of claim 1, wherein the organic-inorganic hybrid layer comprises an organic silicon compound.

3. The light emitting device of claim 1, wherein a proportion of the reduced graphene oxide dispersed in the planarization layer is in a range of 1.5 wt % to 15 wt %.

4. The light emitting device of claim 1, wherein a thickness of the planarization layer is in a range of 10 nm to 50 nm.

5. The light emitting device of claim 4, wherein a surface roughness of the planarization layer is less than 1 nm root-mean-square (RMS).

6. The light emitting device of claim 5, wherein the surface roughness of the planarization layer is in a range of 0.3 nm RMS to 0.5 nm RMS.

7. The light emitting device of claim 1, wherein the first electrode is a transparent electrode and the second electrode is a semi-transmissive electrode that is configured to reflect part of light and transmit a remaining part of the light.

8. The light emitting device of claim 7, wherein the second electrode comprises a reflective metal, and a thickness of the second electrode is in a range of 10 nm to 50 nm.

9. The light emitting device of claim 1, wherein the reflective layer and the second electrode form a micro cavity having a resonance wavelength.

10. The light emitting device of claim 9, wherein the resonance wavelength of the micro cavity is $\lambda$, a diameter of each of the plurality of nanostructures of the reflective layer, a height of each of the plurality of nanostructures, and a period of the plurality of nanostructures are determined such that an optical length of the micro cavity satisfies $n\lambda/2$, where n is a natural number.

11. The light emitting device of claim 9, wherein a period of the plurality of nanostructures is less than the resonance wavelength of the micro cavity.

12. The light emitting device of claim 1, wherein the reflective layer further comprises a base, and
wherein the plurality of nanostructures protrude toward the planarization layer from an upper surface of the base.

13. The light emitting device of claim 12, wherein the reflective layer further comprises a plurality of recesses that are recessed from the upper surface of the base and two-dimensionally provided.

14. The light emitting device of claim 13, wherein the reflective layer and the second electrode form a micro cavity having a resonance wavelength,
wherein the organic emission layer is configured to emit visible light comprising light of a first wavelength and light of a second wavelength,
wherein the first wavelength is $\lambda$, a diameter of each of the plurality of nanostructures of the reflective layer, a height of each of the plurality of nanostructures, and a period of the plurality of nanostructures are determined such that an optical length of the micro cavity satisfies $n\lambda/2$, where n is a natural number, and
wherein a diameter of each of the plurality of recesses is determined such that the plurality of recesses are configured to absorb the light of the second wavelength.

15. The light emitting device of claim 1, wherein the reflective layer comprises a metal material comprising silver (Ag), aluminum (Al), gold (Au), nickel (Ni), or an alloy thereof.

16. A display apparatus comprising:
a first pixel configured to emit light of a first wavelength; and
a second pixel configured to emit light of a second wavelength different from the first wavelength,
wherein the first pixel comprises:
a reflective layer comprising a plurality of nanostructures that are periodically two-dimensionally arranged;
a planarization layer disposed on the reflective layer;
a first electrode disposed on the planarization layer;
an organic emission layer disposed on the first electrode, the organic emission layer being configured to emit visible light comprising the light of the first wavelength and the light of the second wavelength; and
a second electrode disposed on the organic emission layer,
wherein the planarization layer comprises a conductive material that is transparent with respect to light emitted by the organic emission layer, and
wherein the planarization layer is disposed on upper surfaces of the plurality of nanostructures such that an air gap is provided between adjacent nanostructures of the plurality of nanostructures.

17. The display apparatus of claim 16, wherein the planarization layer further comprises an organic-inorganic hybrid layer in which reduced graphene oxide is dispersed.

18. The display apparatus of claim 17, wherein the organic-inorganic hybrid layer comprises an organic silicon compound.

19. The display apparatus of claim 17, wherein a proportion of the reduced graphene oxide dispersed in the planarization layer is in a range of 1.5 wt % to 15 wt %.

20. The display apparatus of claim 16, wherein a thickness of the planarization layer is in a range of 10 nm to 50 nm.

21. The display apparatus of claim 20, wherein a surface roughness of the planarization layer is less than 1 nm root-mean-square (RMS).

22. The display apparatus of claim 21, wherein the surface roughness of the planarization layer is in a range of 0.3 nm RMS to 0.5 nm RMS.

23. The display apparatus of claim 16, wherein the first electrode is a transparent electrode and the second electrode is a semi-transmissive electrode that is configured to reflect part of light and transmit a remaining part of the light.

24. The display apparatus of claim 16, wherein the reflective layer and the second electrode form a micro cavity having a resonance wavelength corresponding to the first wavelength, and wherein the first wavelength is λ, a diameter of each of the plurality of nanostructures of the reflective layer, a height of each of the plurality of nanostructures, and a period of the plurality of nanostructures are determined such that an optical length of the micro cavity satisfies nλ/2, where n is a natural number.

25. A method of manufacturing a light emitting device, the method comprising:
coating a substrate with a mixture of graphene oxide and tetramethyl orthosilicate (TMOS) sol in a solvent;
curing the mixture coated on the substrate;
annealing the cured mixture to reduce graphene oxide to reduced graphene oxide and form a planarization layer comprising an organic-inorganic hybrid layer in which the reduced graphene oxide is dispersed;
transferring the planarization layer to a reflective layer comprising a plurality of nanostructures that are periodically two-dimensionally arranged;
disposing a first electrode on the planarization layer;
disposing an organic emission layer on the first electrode; and
disposing a second electrode on the organic emission layer,
wherein the planarization layer is conductive and transparent with respect to light emitted by the organic emission layer,
wherein the planarization layer is disposed on upper surfaces of the plurality of nanostructures such that an air gap is provided between adjacent nanostructures the plurality of nanostructures.

26. A light emitting device comprising:
a reflective layer comprising:
a plurality of nanostructures that are periodically two-dimensionally provided; and
a plurality of recesses that are periodically two-dimensionally provided;
a planarization layer disposed on the reflective layer;
a first electrode disposed on the planarization layer;
an organic emission layer disposed on the first electrode; and
a second electrode disposed on the organic emission layer,
wherein the planarization layer comprises a conductive material transparent with respect to light emitted by the organic emission layer,
wherein the planarization layer is disposed on upper surfaces of the plurality of nanostructures such that an air gap is provided between adjacent nanostructures of the plurality of nanostructures, and
wherein the planarization layer further comprises an organic-inorganic hybrid layer in which reduced graphene oxide is dispersed.

* * * * *